(12) United States Patent
Koyama

(10) Patent No.: US 8,717,262 B2
(45) Date of Patent: May 6, 2014

(54) DISPLAY DEVICE AND METHOD FOR FABRICATING THE SAME

(71) Applicant: Semiconductor Energy Laboratory Co., Ltd., Kanagawa-ken (JP)

(72) Inventor: Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/731,482

(22) Filed: Dec. 31, 2012

(65) Prior Publication Data

US 2013/0119408 A1    May 16, 2013

Related U.S. Application Data

(63) Continuation of application No. 12/609,924, filed on Oct. 30, 2009, now Pat. No. 8,344,992, and a continuation of application No. 09/791,182, filed on Feb. 23, 2001, now Pat. No. 7,612,753.

(30) Foreign Application Priority Data

Feb. 29, 2000 (JP) ................................. 2000-055013
Feb. 29, 2000 (JP) ................................. 2000-055017

(51) Int. Cl.
*G09G 3/30* (2006.01)

(52) U.S. Cl.
USPC .......................................................... 345/76

(58) Field of Classification Search
USPC .................................................... 345/76–77
See application file for complete search history.

(56) References Cited

U.S. PATENT DOCUMENTS

| 4,644,338 A | 2/1987 | Aoki et al. |
| 5,206,749 A | 4/1993 | Zavracky et al. |
| 5,256,562 A | 10/1993 | Vu et al. |
| 5,258,320 A | 11/1993 | Zavracky et al. |
| 5,258,325 A | 11/1993 | Spitzer et al. |
| 5,300,788 A | 4/1994 | Fan et al. |
| 5,317,236 A | 5/1994 | Zavracky et al. |
| 5,317,436 A | 5/1994 | Spitzer et al. |
| 5,331,149 A | 7/1994 | Spitzer et al. |
| 5,362,671 A | 11/1994 | Zavracky et al. |

(Continued)

FOREIGN PATENT DOCUMENTS

| CN | 1217807 A | 5/1999 |
| EP | 0 853 254 A2 | 7/1998 |

(Continued)

OTHER PUBLICATIONS

Office Action re Korean patent application No. KR 10-2001-0010388, dated May 10, 2007 (with English translation).

(Continued)

*Primary Examiner* — Waseem Moorad
(74) *Attorney, Agent, or Firm* — Husch Blackwell LLP

(57) ABSTRACT

An inexpensive display device, as well as an electrical apparatus employing the same, can be provided. In the display device in which a pixel section and a driver circuit are included on one and the same insulating surface, the driver circuit includes a decoder 100 and a buffer section 101. The decoder 100 includes a plurality of NAND circuits each including p-channel TFTs 104 to 106 connected to each other in parallel and other p-channel TFTs 107 to 109 connected to each other in series. The buffer section 101 includes a plurality of buffers each including three p-channel TFTs 114 to 116.

12 Claims, 17 Drawing Sheets

(56) References Cited

U.S. PATENT DOCUMENTS

| | | |
|---|---|---|
| 5,376,561 A | 12/1994 | Vu et al. |
| 5,376,979 A | 12/1994 | Zavracky et al. |
| 5,377,031 A | 12/1994 | Vu et al. |
| 5,396,304 A | 3/1995 | Salerno et al. |
| 5,420,055 A | 5/1995 | Vu et al. |
| 5,438,241 A | 8/1995 | Zavracky et al. |
| 5,444,557 A | 8/1995 | Spitzer et al. |
| 5,453,405 A | 9/1995 | Fan et al. |
| 5,453,856 A | 9/1995 | Kim |
| 5,467,154 A | 11/1995 | Gale et al. |
| 5,475,514 A | 12/1995 | Salerno et al. |
| 5,499,124 A | 3/1996 | Vu et al. |
| 5,528,397 A | 6/1996 | Zavracky et al. |
| 5,539,550 A | 7/1996 | Spitzer et al. |
| 5,574,475 A | 11/1996 | Callahan, Jr. et al. |
| 5,576,641 A | 11/1996 | Yoneya et al. |
| 5,576,858 A | 11/1996 | Ukai et al. |
| 5,578,865 A | 11/1996 | Vu et al. |
| 5,581,385 A | 12/1996 | Spitzer et al. |
| 5,583,335 A | 12/1996 | Spitzer et al. |
| 5,604,358 A | 2/1997 | Kim |
| 5,643,826 A | 7/1997 | Ohtani et al. |
| 5,654,811 A | 8/1997 | Spitzer et al. |
| 5,663,589 A | 9/1997 | Saitoh et al. |
| 5,666,175 A | 9/1997 | Spitzer et al. |
| 5,670,792 A | 9/1997 | Utsugi et al. |
| 5,692,820 A | 12/1997 | Gale et al. |
| 5,701,167 A | 12/1997 | Yamazaki |
| 5,702,963 A | 12/1997 | Vu et al. |
| 5,703,617 A | 12/1997 | Callahan, Jr. et al. |
| 5,705,424 A | 1/1998 | Zavracky et al. |
| 5,713,652 A | 2/1998 | Zavracky et al. |
| 5,714,769 A | 2/1998 | Kim |
| 5,714,968 A | 2/1998 | Ikeda |
| 5,719,591 A | 2/1998 | Callahan, Jr. et al. |
| 5,726,676 A | 3/1998 | Callahan, Jr. et al. |
| 5,736,768 A | 4/1998 | Zavracky et al. |
| 5,743,614 A | 4/1998 | Salerno et al. |
| 5,748,165 A | 5/1998 | Kubota et al. |
| 5,751,261 A | 5/1998 | Zavracky et al. |
| 5,757,445 A | 5/1998 | Vu et al. |
| 5,790,222 A | 8/1998 | Kim |
| 5,834,327 A | 11/1998 | Yamazaki et al. |
| 5,858,624 A | 1/1999 | Chou et al. |
| 5,861,929 A | 1/1999 | Spitzer |
| 5,889,291 A | 3/1999 | Koyama et al. |
| 5,892,495 A | 4/1999 | Sakai et al. |
| 5,920,083 A | 7/1999 | Bae |
| 5,923,962 A | 7/1999 | Ohtani et al. |
| 5,952,699 A | 9/1999 | Yamazaki et al. |
| 5,956,011 A | 9/1999 | Koyama et al. |
| 5,990,542 A | 11/1999 | Yamazaki |
| 5,990,555 A | 11/1999 | Ohori et al. |
| 5,990,998 A | 11/1999 | Park et al. |
| 6,028,472 A | 2/2000 | Nagumo |
| 6,031,249 A | 2/2000 | Yamazaki et al. |
| 6,031,290 A | 2/2000 | Miyazaki et al. |
| 6,037,924 A | 3/2000 | Koyama et al. |
| 6,043,800 A | 3/2000 | Spitzer et al. |
| 6,067,062 A | 5/2000 | Takasu et al. |
| 6,072,445 A | 6/2000 | Spitzer et al. |
| 6,078,366 A | 6/2000 | Dohjo et al. |
| 6,084,461 A | 7/2000 | Colbeth et al. |
| 6,091,194 A | 7/2000 | Swirbel et al. |
| 6,107,983 A | 8/2000 | Masuda et al. |
| 6,121,950 A | 9/2000 | Zavracky et al. |
| 6,140,980 A | 10/2000 | Spitzer et al. |
| 6,143,582 A | 11/2000 | Vu et al. |
| 6,156,590 A | 12/2000 | Yamazaki et al. |
| 6,169,391 B1 | 1/2001 | Lei |
| 6,191,408 B1 | 2/2001 | Shinotsuka et al. |
| 6,194,837 B1 | 2/2001 | Ozawa |
| 6,207,969 B1 | 3/2001 | Yamazaki |
| 6,208,395 B1 | 3/2001 | Kanoh et al. |
| 6,225,966 B1 | 5/2001 | Ohtani et al. |
| 6,232,136 B1 | 5/2001 | Zavracky et al. |
| 6,278,132 B1 | 8/2001 | Yamazaki et al. |
| 6,292,183 B1 | 9/2001 | Yamazaki et al. |
| 6,310,598 B1 | 10/2001 | Koyama et al. |
| 6,317,175 B1 | 11/2001 | Salerno et al. |
| 6,320,568 B1 | 11/2001 | Zavracky |
| 6,372,558 B1 | 4/2002 | Yamanaka et al. |
| 6,403,985 B1 | 6/2002 | Fan et al. |
| 6,414,783 B2 | 7/2002 | Zavracky et al. |
| 6,424,020 B1 | 7/2002 | Vu et al. |
| 6,441,399 B1 | 8/2002 | Koyama et al. |
| 6,441,468 B1 | 8/2002 | Yamazaki |
| 6,445,059 B1 | 9/2002 | Yamazaki |
| 6,456,350 B1 | 9/2002 | Ashizawa et al. |
| 6,461,899 B1 | 10/2002 | Kitakado et al. |
| 6,462,722 B1 | 10/2002 | Kimura et al. |
| 6,465,806 B2 | 10/2002 | Kubota et al. |
| 6,486,929 B1 | 11/2002 | Vu et al. |
| 6,489,222 B2 | 12/2002 | Yoshimoto |
| 6,498,596 B1 | 12/2002 | Nakamura et al. |
| 6,507,332 B1 | 1/2003 | Kuwabara et al. |
| 6,511,187 B1 | 1/2003 | Salerno et al. |
| 6,515,310 B2 | 2/2003 | Yamazaki et al. |
| 6,521,940 B1 | 2/2003 | Vu et al. |
| 6,522,315 B2 | 2/2003 | Ozawa et al. |
| 6,524,877 B1 | 2/2003 | Nakazawa et al. |
| 6,525,719 B2 | 2/2003 | Yamazaki et al. |
| 6,545,424 B2 | 4/2003 | Ozawa |
| 6,558,008 B1 | 5/2003 | Salerno et al. |
| 6,580,475 B2 | 6/2003 | Yamazaki et al. |
| 6,593,978 B2 | 7/2003 | Vu et al. |
| 6,599,791 B1 | 7/2003 | Koyama et al. |
| 6,608,613 B2 | 8/2003 | Koyama et al. |
| 6,608,654 B2 | 8/2003 | Zavracky et al. |
| 6,627,953 B1 | 9/2003 | Vu et al. |
| 6,636,185 B1 | 10/2003 | Spitzer et al. |
| 6,670,225 B2 | 12/2003 | Ohnuma |
| 6,677,221 B2 | 1/2004 | Kawasaki et al. |
| 6,690,033 B2 | 2/2004 | Yamazaki et al. |
| 6,703,671 B1 | 3/2004 | Yamazaki et al. |
| 6,713,748 B1 | 3/2004 | Tsutsumi et al. |
| 6,730,966 B2 | 5/2004 | Koyama |
| 6,747,627 B1 | 6/2004 | Koyama et al. |
| 6,787,887 B2 | 9/2004 | Yamazaki |
| 6,825,488 B2 | 11/2004 | Yamazaki et al. |
| 6,839,045 B2 | 1/2005 | Ozawa et al. |
| 6,858,878 B2 | 2/2005 | Yamazaki et al. |
| 6,919,935 B2 | 7/2005 | Vu et al. |
| 6,943,764 B1 | 9/2005 | Koyama et al. |
| 7,034,381 B2 | 4/2006 | Yamazaki |
| 7,075,501 B1 | 7/2006 | Spitzer et al. |
| 7,084,019 B2 | 8/2006 | Yamazaki et al. |
| 7,113,154 B1 | 9/2006 | Inukai |
| 7,166,862 B2 | 1/2007 | Koyama et al. |
| 7,180,483 B2 | 2/2007 | Kimura et al. |
| 7,202,551 B2 | 4/2007 | Yamazaki |
| 7,214,555 B2 | 5/2007 | Yamazaki et al. |
| 7,221,339 B2 | 5/2007 | Ozawa et al. |
| 7,253,793 B2 | 8/2007 | Ozawa et al. |
| 7,271,858 B2 | 9/2007 | Yamazaki et al. |
| 7,413,937 B2 | 8/2008 | Yamazaki |
| 7,483,091 B1 | 1/2009 | Yamazaki et al. |
| 7,612,753 B2 | 11/2009 | Koyama |
| 7,710,364 B2 | 5/2010 | Ozawa et al. |
| 7,776,663 B2 | 8/2010 | Yamazaki et al. |
| 7,880,696 B2 | 2/2011 | Ozawa et al. |
| 8,012,782 B2 | 9/2011 | Yamazaki et al. |
| 8,154,199 B2 | 4/2012 | Ozawa et al. |
| 8,188,647 B2 | 5/2012 | Kimura et al. |
| 8,247,967 B2 | 8/2012 | Ozawa et al. |
| 8,344,992 B2 | 1/2013 | Koyama |
| 2001/0002703 A1 | 6/2001 | Koyama |
| 2001/0025959 A1 | 10/2001 | Yamazaki et al. |
| 2001/0030322 A1 | 10/2001 | Yamazaki et al. |
| 2001/0048115 A1 | 12/2001 | Yamazaki et al. |
| 2002/0024493 A1 | 2/2002 | Ozawa et al. |
| 2002/0110941 A1 | 8/2002 | Yamazaki et al. |
| 2002/0158288 A1 | 10/2002 | Yamazaki et al. |
| 2003/0020084 A1 | 1/2003 | Fan et al. |

(56) References Cited

U.S. PATENT DOCUMENTS

| | | |
|---|---|---|
| 2003/0057425 A1 | 3/2003 | Zavracky et al. |
| 2003/0117369 A1 | 6/2003 | Spitzer et al. |
| 2003/0214006 A1 | 11/2003 | Nakamura et al. |
| 2003/0231273 A1 | 12/2003 | Kimura et al. |
| 2004/0085292 A1 | 5/2004 | Spitzer et al. |
| 2005/0001541 A1 | 1/2005 | Yamazaki et al. |
| 2005/0259060 A1 | 11/2005 | Koyama et al. |
| 2006/0273317 A1 | 12/2006 | Yamazaki et al. |
| 2006/0273995 A1 | 12/2006 | Ozawa et al. |
| 2008/0246700 A1 | 10/2008 | Ozawa et al. |
| 2009/0072758 A1 | 3/2009 | Kimura et al. |

FOREIGN PATENT DOCUMENTS

| | | |
|---|---|---|
| EP | 0 895 219 A1 | 2/1999 |
| EP | 0 909 972 A2 | 4/1999 |
| EP | 0 917 127 A1 | 5/1999 |
| EP | 0 932 137 A1 | 7/1999 |
| EP | 0 935 389 A1 | 8/1999 |
| EP | 1 128 430 A2 | 8/2001 |
| EP | 1 130 566 A2 | 9/2001 |
| EP | 1 237 191 A2 | 9/2002 |
| EP | 1 255 240 A1 | 11/2002 |
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 505 649 A2 | 2/2005 |
| EP | 1 619 654 A1 | 1/2006 |
| EP | 1 830 342 A2 | 9/2007 |
| EP | 1 830 343 A2 | 9/2007 |
| EP | 1 830 344 A2 | 9/2007 |
| JP | 1-101519 | 4/1989 |
| JP | 03-197994 A | 8/1991 |
| JP | 6-148685 | 5/1994 |
| JP | 6-258670 | 9/1994 |
| JP | 6-281957 | 10/1994 |
| JP | 7-503557 A | 4/1995 |
| JP | 7-235680 | 9/1995 |
| JP | 8-501887 A | 2/1996 |
| JP | 8-262475 A | 10/1996 |
| JP | 8-274336 | 10/1996 |
| JP | 9-160509 | 6/1997 |
| JP | 9-505904 | 6/1997 |
| JP | 9-223804 | 8/1997 |
| JP | 10-48640 | 2/1998 |
| JP | 10-177187 A | 6/1998 |
| JP | 11-24604 | 1/1999 |
| JP | 11-231805 | 8/1999 |
| JP | 11-260546 | 9/1999 |
| JP | 2001-313397 | 11/2001 |
| JP | 2001-318624 | 11/2001 |
| JP | 2002-43578 | 2/2002 |
| WO | WO 92/12453 A1 | 7/1992 |
| WO | WO 92/13363 A2 | 8/1992 |
| WO | WO 93/15589 A1 | 8/1993 |
| WO | WO 93/16491 A1 | 8/1993 |
| WO | WO 93/18428 A2 | 9/1993 |
| WO | WO 94/07177 A1 | 3/1994 |
| WO | WO 94/10600 A1 | 5/1994 |
| WO | WO 94/10794 A1 | 5/1994 |
| WO | WO 94/18791 A1 | 8/1994 |
| WO | WO 95/11506 A1 | 4/1995 |
| WO | WO 95/25983 A1 | 9/1995 |

OTHER PUBLICATIONS

European Search Report re application No. EP 01104893.1, dated Feb. 18, 2008.

Office Action re Chinese patent application No. CN 200810129601.7, dated Sep. 12, 2012 (with English translation).

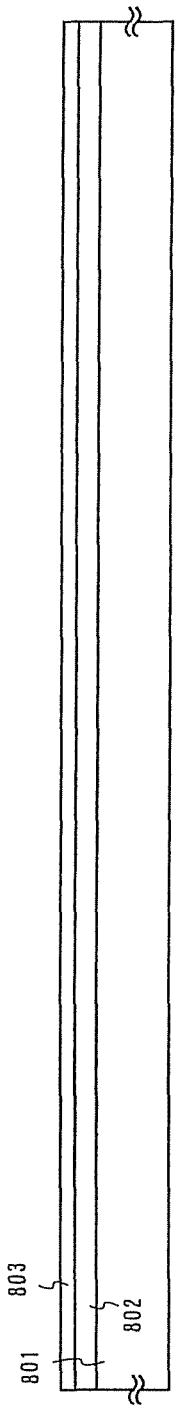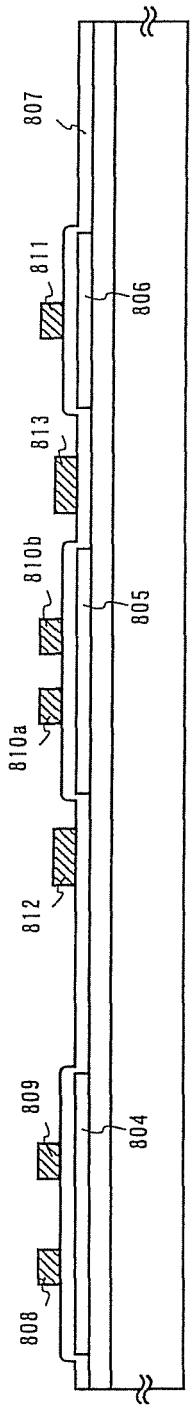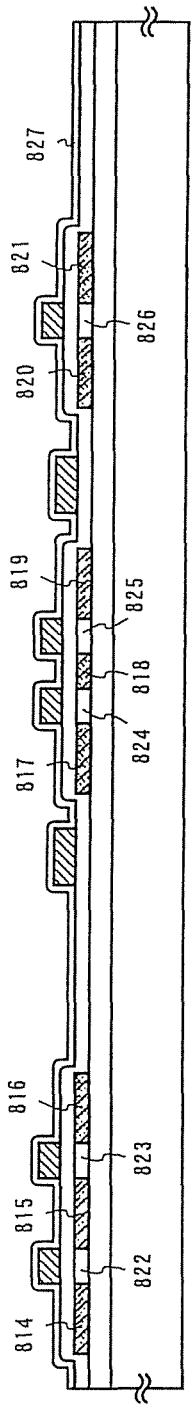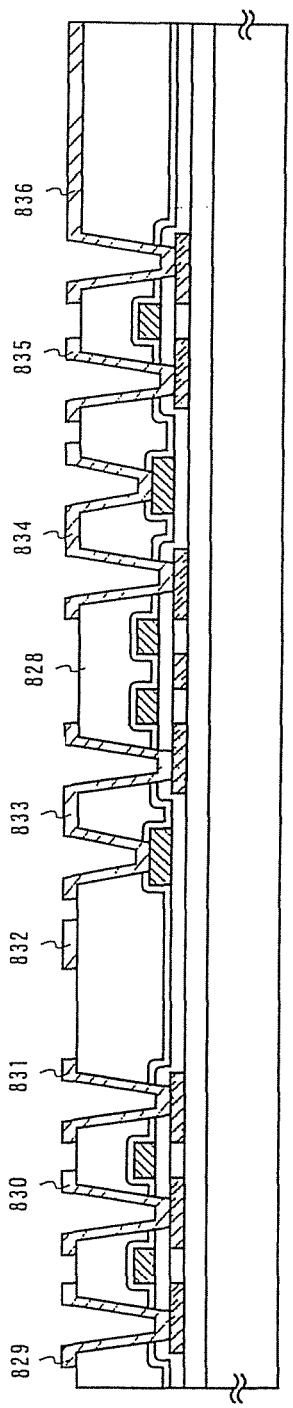
Fig. 8A
Fig. 8B
Fig. 8C
Fig. 8D

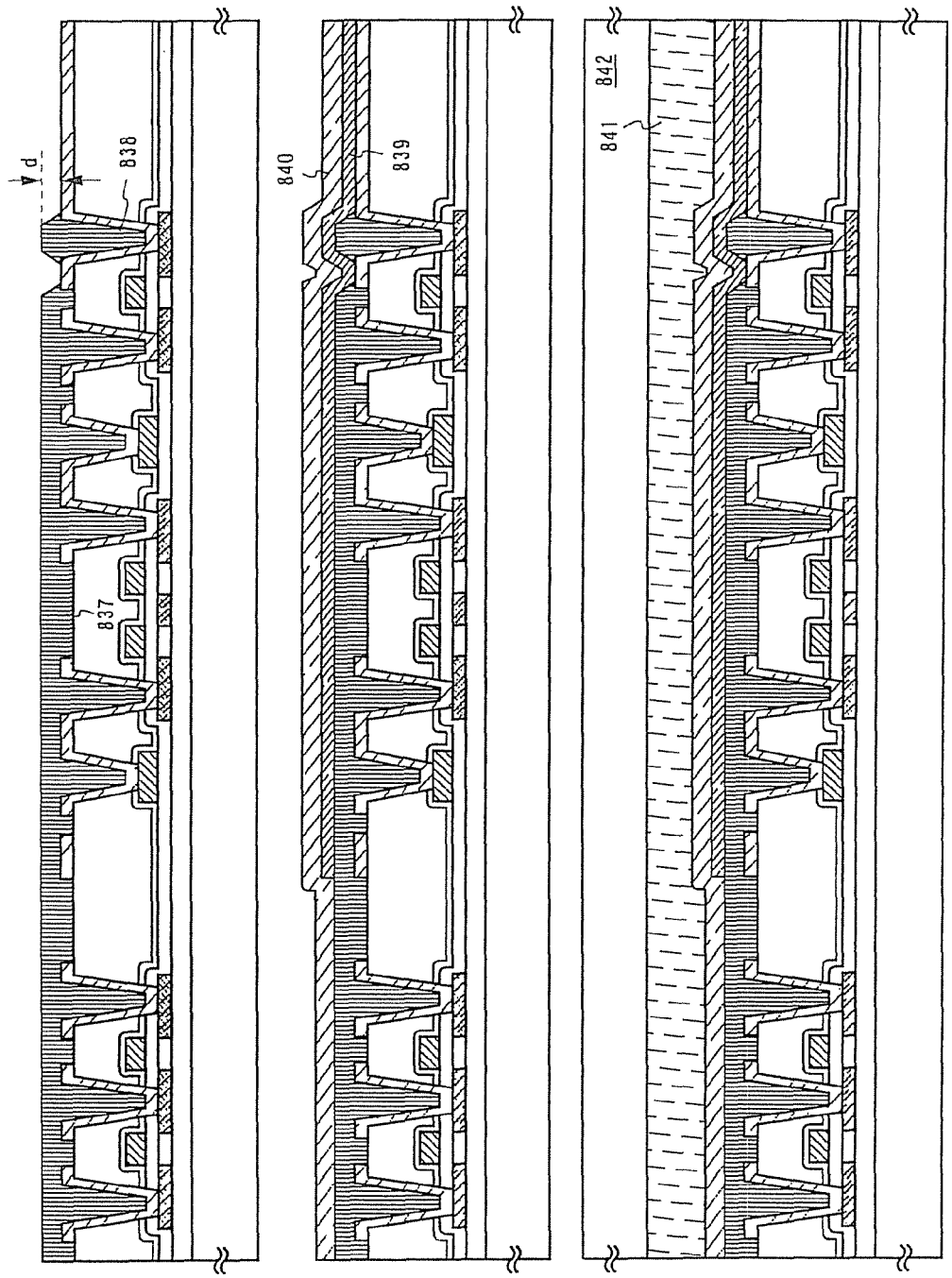

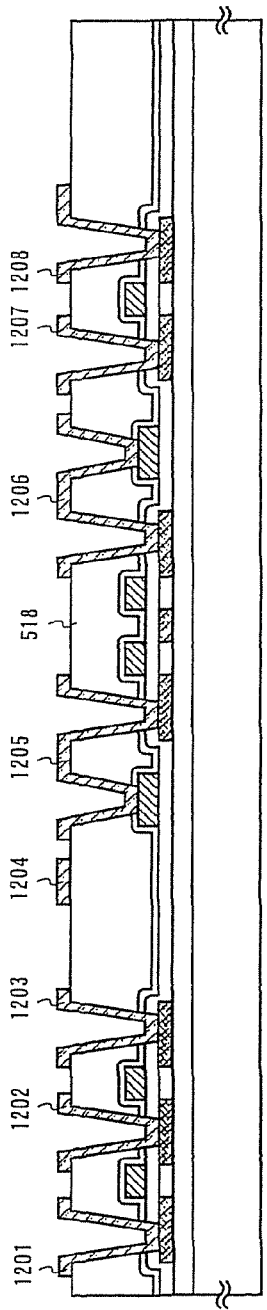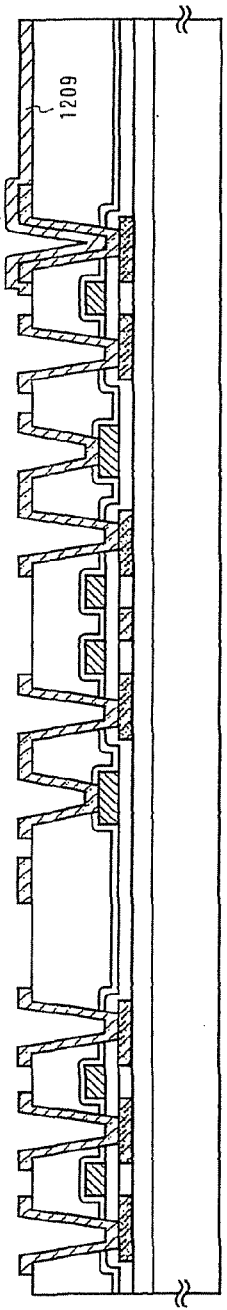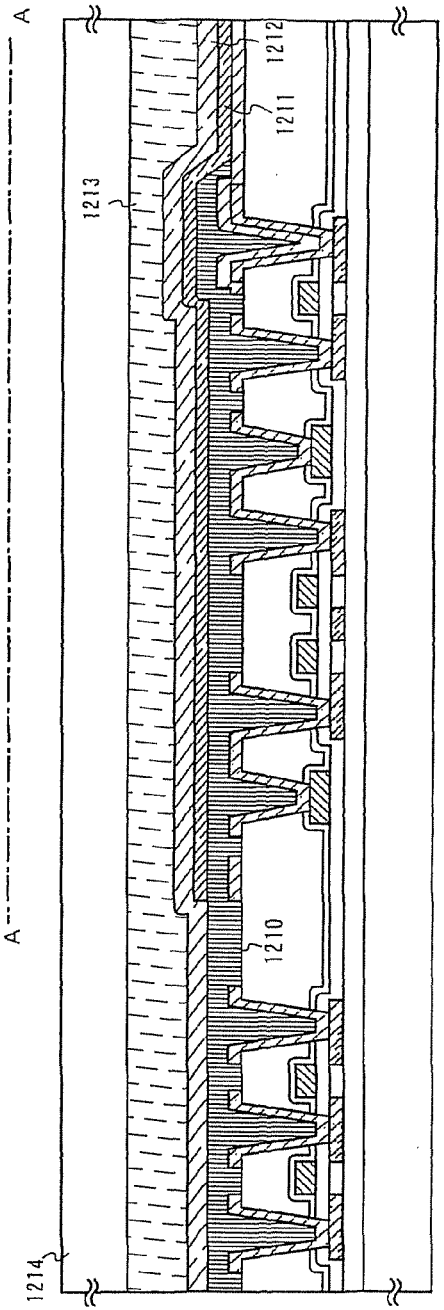
Fig. 12A
Fig. 12B
Fig. 12C

DISPLAY DEVICE AND METHOD FOR FABRICATING THE SAME

This application is a continuation of copending U.S. application Ser. No. 12/609,924, filed on Oct. 30, 2009 which is a continuation of U.S. application Ser. No. 09/791,182, filed on Feb. 23, 2001 (now U.S. Pat. No. 7,612,753 issued Nov. 3, 2009).

BACKGROUND OF THE INVENTION

1. Field of the Invention

The present invention relates to a device having an element in which a light-emitting material is interposed between electrodes (hereinafter, such a device is referred to as the light-emitting device and such an element is referred to as the light-emitting element). In particular, the present invention relates to a device including on one and the same insulating surface, a pixel section and a driver circuit for transmitting a signal to the pixel section. In addition, the present invention can be used for a device having an element in which liquid crystal is interposed between electrodes (hereinafter, such a device is referred to as the liquid crystal display device and such an element is referred to as the liquid crystal element). It should be noted that in the present specification, the light-emitting device and the liquid crystal display device are collectively referred to as the display device.

Light-emitting materials that can be used in the present invention include all of light-emitting materials that emit light (phosphorescent light and/or fluorescent light) via singlet excitation or triplet excitation, or both of these excitations.

2. Description of the Related Art

Recently, developments for a light-emitting device including a light-emitting element which utilizes a light-emitting material capable of providing EL (Electro Luminescence) has been progressed (hereinafter, such a light-emitting device is simply referred to as the light-emitting device; such a light-emitting element is referred to as the EL element; and such a light-emitting material is referred to as the EL material). The light-emitting device has a structure having an EL element in which a thin film made of the EL material is interposed between an anode and a cathode.

Although in the developments for the light-emitting devices the passive-matrix type devices have been mainly focused, it has been considered that there will exist disadvantages with the passive-matrix type light-emitting devices in that a sufficient reliability (a long lifetime of the EL element) cannot be ensured with a higher precision pixel section which requires the luminance of the EL element to be increased. From the above circumstances, the active-matrix type light-emitting devices are recently drawing much attention for the purpose of realizing a higher precision display. The active-matrix type light-emitting device is characterized in that an active element is provided within each pixel so that the EL element is allowed to emit light in accordance with an input signal. As the active element, a TFT (Thin Film Transistor) is commonly employed.

Reference is now made to FIG. 4, which illustrates a pixel structure of the active-matrix type light-emitting device. In FIG. 4, reference numeral 401 denotes a source wiring, 402 denotes a gate wiring, 403 denotes a TFT functioning as a switching element (hereinafter referred to as the switching TFT), and 404 denotes a capacitor electrically connected to a drain of the switching TFT 403.

The drain of the switching TFT 403 is also electrically connected to a gate electrode of a current-controlling TFT 405. A source of the current-controlling TFT 405 is electrically connected to a current supply line 406, while a drain thereof is electrically connected to an EL element 407. In other word, the current-controlling TFT 405 can function as an element for controlling current flowing through the EL element 407.

The luminance of the EL element can be controlled by thus providing the two TFTs having different functions, respectively, in each of the pixels. As a result, a light-emitting period can substantially correspond to one-frame period, and an image can be displayed while suppressing the luminance even with a higher precision pixel section. Furthermore, advantages of the active-matrix type device include the capability of forming, as a driver circuit for transmitting a signal to the pixel section, a shift register or a sampling circuit with TFTs on the same substrate. This enables fabrication of a very compact light-emitting device.

However, it is difficult to ensure a sufficient production yield of the active-matrix type light-emitting device, as compared to the passive-matrix type device that has a simpler structure, since a plurality of TFTs have to be formed on the same substrate in the active-matrix type device. Particularly in the case where the driver circuit is to be provided on the same substrate, a line defect may arise in which one line of the pixels does not operate because of a defect of operation. In addition, since fabrication steps for the TFTs are relatively complicated, there is the higher possibility of increasing, a fabrication cost of the active-matrix type device, as compared to that of the passive-matrix type device. In such a case, a disadvantage of increasing a price of an electrical apparatus employing the active-matrix type light-emitting device in its display section may arise.

Thus, the present invention is intended to reduce a fabrication cost of the active-matrix type display device so as to provide an inexpensive display device. In addition, the present invention is also intended to provide an inexpensive electrical apparatus that employs in its display section, the display device in accordance with the present invention.

SUMMARY OF THE INVENTION

In accordance with the present invention, in order to reduce a fabrication cost of an active-matrix type display device, all of the TFTs to be used in a pixel section are provided as a TFT of one conductivity type (indicating herein either a p-channel TFT or an n-channel TFT), and furthermore, a driver circuit is also formed entirely with TFTs of the same conductivity type as in the pixel section. Thus, a fabrication process can be significantly reduced, and therefore, the fabrication cost can be reduced.

For the above purpose, in accordance with one aspect of the present invention, all of a source wiring, a gate electrode, a gate wiring (which is a line that transmits a signal to the gate electrode), and a current supply line are simultaneously formed. In other word, an identical electrically conductive (hereinafter simply referred to as "conductive") film is formed on the same surface. In addition, in accordance with another aspect of the present invention, a line (referred to as the connecting wiring in the present specification) that connects the TFT to a line for connecting a plurality of independently formed gate wirings to each other, or the source wiring, or the current supply line, is formed on the same surface with the identical conductive film as the drain wiring of the current-controlling TFT.

Furthermore, in accordance with a further important aspect of the present invention, a driver circuit is formed of TFTs of one and the same conductivity type. In other word, in contrast to the conventional driver circuit that is in general designed based on a CMOS circuit in which an n-channel TFT and a p-channel TFT are complimentarily combined to each other, the driver circuit in accordance with the present invention is formed by combining only the p-channel TFTs or the n-channel TFTs.

BRIEF DESCRIPTION OF THE DRAWINGS

In the accompanying drawings:

FIGS. 8(A) through 8(D) show various fabrication steps of the light-emitting device;
FIGS. 9(A) through 9(C) show various fabrication steps of the light-emitting device;
FIGS. 12(A) through 12(C) show various fabrication steps of the light-emitting device.

DETAILED DESCRIPTION OF THE PREFERRED EMBODIMENTS

Figure 1:
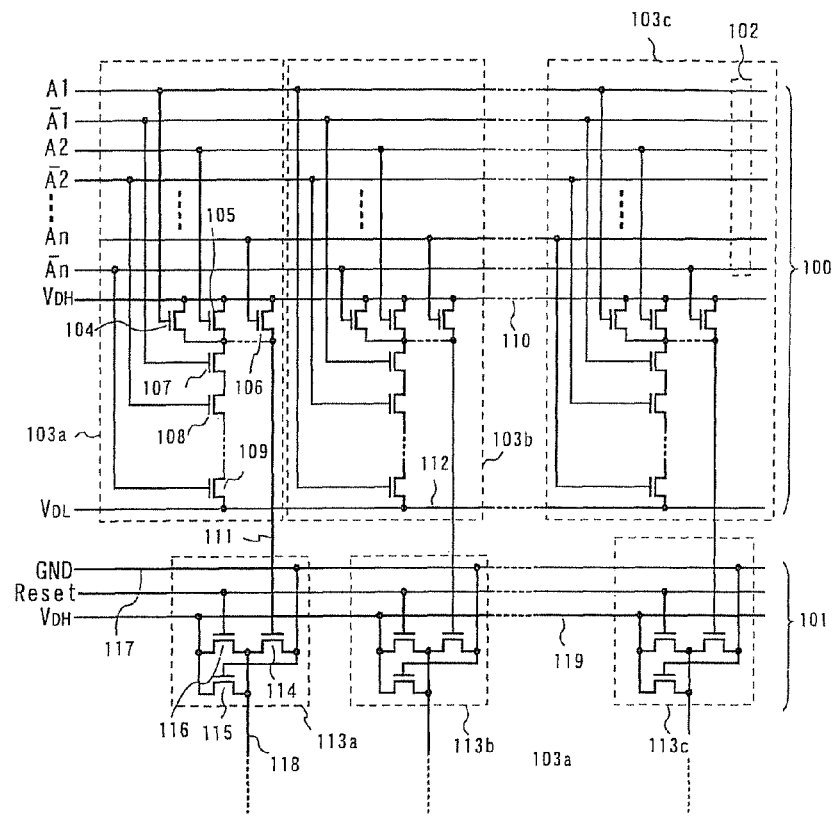
FIG. 1 shows a structure of a gate-side driver circuit.
Figure 2:
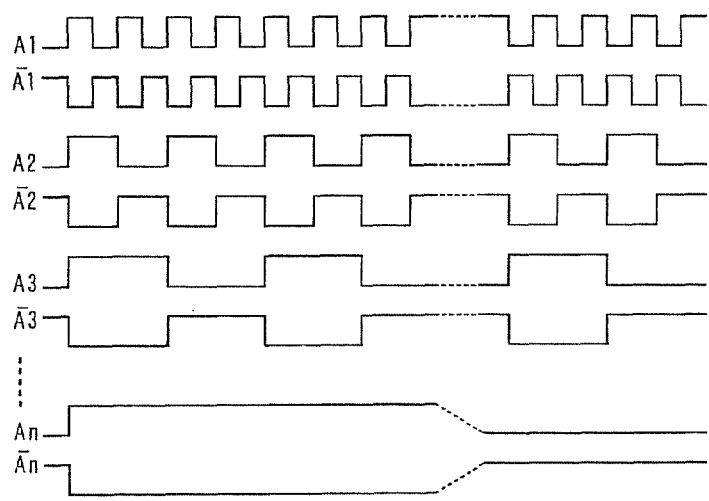
FIG. 2 shows a timing chart of decoder input signals.

With now reference to FIGS. 1 and 2, a driver circuit to be used in the present invention will be described. In accordance with the present invention, instead of a typical shift register, a decoder employing p-channel TFTs as shown in FIG. 1 is used. FIG. 1 illustrates an example of a gate-side driver circuit.

In FIG. 1, reference numeral 100 denotes a decoder in the gate-side driver circuit, and 101 denotes a buffer section of the gate-side driver circuit. Here, the buffer section refers to a section in which a plurality of buffers (buffer amplifiers) are integrated. Furthermore, the buffer refers to a circuit capable of exhibiting the driving capability without providing any adverse effects of a subsequent stage on a previous stage.

The gate-side decoder 100 will be now described. Reference numeral 102 denotes input signal lines (hereinafter referred to as the selection lines) of the decoder 100, and more specifically indicates A1, A1 bar (a signal having an inverted polarity with respect to A1), A2, A2 bar (a signal having an inverted polarity with respect to A2), . . . , An, and An bar (a signal having an inverted polarity with respect to An). In other word, it can be considered that the 2n selection lines are arranged.

The number of the selection lines is determined based on the number of gate wirings to be output from the gate-side driver circuit. For example, in the case where a pixel section for VGA display is provided, 480 gate wirings are required, which in turn requires a total of 18 selection lines to be provided for 9 bits (corresponding to the case where n=9). The selection lines 102 transmit signals shown in the timing chart in FIG. 2. As shown in FIG. 2, assuming that a frequency of A1 is normalized to be 1, a frequency of A2 can be expressed as $2^{-1}$, a frequency of A3 can be expressed as $2^{-2}$, and a frequency of An can be expressed as $2^{-(n-1)}$.

Reference numeral 103a denotes a first-stage NAND circuit (also referred to as the NAND cell), while 103b and 103c denote a second-stage and an n-th stage NAND circuits, respectively. The required number of the NAND circuits is equal to the number of the gate wirings, and specifically, n NAND circuits are required here. In other word, the decoder 100 in accordance with the present invention is composed of a plurality of the NAND circuits.

In each of the NAND circuits 103a to 103c, p-channel TFTs 104 to 109 are combined to form a NAND circuit. Actually, 2n TFTs are employed in each of the NAND circuits 103. Furthermore, a gate of each of the p-channel TFTs 104 to 109 is connected to either one of the selection lines 102 (A1, A1 bar, A2, A2 bar, . . . , An, An bar).

In this case, in the NAND circuit 103a, the p-channel TFTs 104 to 106 that respectively have the gates connected to any of A1, A2, . . . , An (which are referred to as the positive selection lines) are connected to each other in parallel, and further connected to a positive power source wiring ($V_{DH}$) 110 as a common source, as well as to an output line 111 as a common drain. On the other hand, the remaining p-channel TFTs 107 to 109 that respectively have the gates connected to any of A1 bar, A2 bar, . . . , An bar (which are referred to as the negative selection lines) are connected to each other in series, and a source of the p-channel TFT 109 positioned at one end of the circuit is connected to a negative power source wiring ($V_{DL}$) 112 while a drain of the p-channel TFT 107 positioned at the other end of the circuit is connected to the output line 111.

As described in the above, the NAND circuit in accordance with the present invention includes the n TFTs of one conductivity type (the p-channel TFTs in this case) connected in series and the other n TFTs of the one conductivity type (the p-channel TFTs in this case) connected in parallel. It should be noted that in the n NAND circuits 103a to 103c, all of combinations among the p-channel TFTs and the selection lines are different from each other. In other word, the output lines 111 are configured so that only one of them is selected, and signals are input to the selection lines such that the output lines 111 are sequentially selected from one side thereof.

Then, the buffer 101 is composed of a plurality of buffers 113a to 113c so as to respectively correspond to the NAND circuits 103a to 103c. It should be noted that the buffers 113a to 113c may have the same structure.

Furthermore, the buffers 113a to 113c are formed with p-channel TFTs 114 to 116 as TFTs of one conductivity type. The output line 111 from the decoder is input as a gate of the corresponding p-channel TFT 114 (a first TFT of the one conductivity type). The p-channel TFT 114 utilizes aground power source wiring (GND) 117 as its source, and a gate wiring 118 as its drain. Moreover, the p-channel TFT 115 (a second TFT of the one conductivity type) utilizes the ground power source line 117 as its gate, a positive power source line ($V_{DH}$) 119 as its source, and the gate wiring 118 as its drain. The p-channel TFT 115 is always in the ON state.

In other words, each of the buffers 113a to 113c in accordance with the present invention includes the first TFT of the one conductivity type (the p-channel TFT 114), and further includes the second TFT of the one conductivity type (the p-channel TFT 115) that is connected to the first TFT of the one conductivity type in series and utilizes the gate of the first TFT of the one conductivity type as the drain.

Furthermore, the p-channel TFT 116 (a third TFT of the one conductivity type) employs a reset signal line (Reset) as its gate, the positive power source line 119 as its source, and the gate wiring 118 as its drain. It should be noted that the ground power source line 117 may be replaced with a negative power source line (which is a power source line for providing a voltage that causes a p-channel TFT, to be used as a switching, element of a pixel, to be in the ON state).

In this case, a channel width (indicated as W1) of the p-channel TFT 115 and a channel width (indicated as W2) of the p-channel TFT 114 satisfy the relationship of W1<W2. The channel width refers to a length of a channel formation region measured in the direction perpendicular to a channel length.

The buffer 113a operates as follows. During a time period in which a positive voltage is being applied to the output line 111, the p-channel TFT 114 is in the OFF state (i.e., its channel is not formed). On the other hand, since the p-channel TFT 115 is always in the ON state (i.e., its channel is formed), a voltage of the positive power source line 119 is applied to the gate wiring 118.

On the other hand, in the case where a negative voltage is applied to the output line 111, the p-channel TFT 114 comes into the ON state. In this case, since the channel width of the p-channel TFT 114 is wider than that of the p-channel TFT 115, the electrical potential of the gate wiring 118 is pulled by an output on the side of the p-channel TFT 114, thereby resulting in the electrical potential of the ground power source line 117 being applied to the gate wiring 118.

Accordingly, the gate wiring 118 outputs a negative voltage (that causes the p-channel TFT, to be used as the switching element of the pixel, to be in the ON state) when a negative voltage is being applied onto the output line 111, while always outputting a positive voltage (that causes the p-channel TFT, to be used as the switching element of the pixel, to be in the OFF state) when a positive voltage is being applied onto the output line 111.

The p-channel TFT 116 is used as a reset switch for forcing the gate wiring 118, to which the negative voltage is being applied, to be pulled up to a positive voltage. Namely, after a selection period of the gate wiring 118 is completed, a reset signal is input so that a positive voltage is applied to the gate wiring 118. It should be noted that the p-channel TFT 116 may be omitted.

Figure 3:
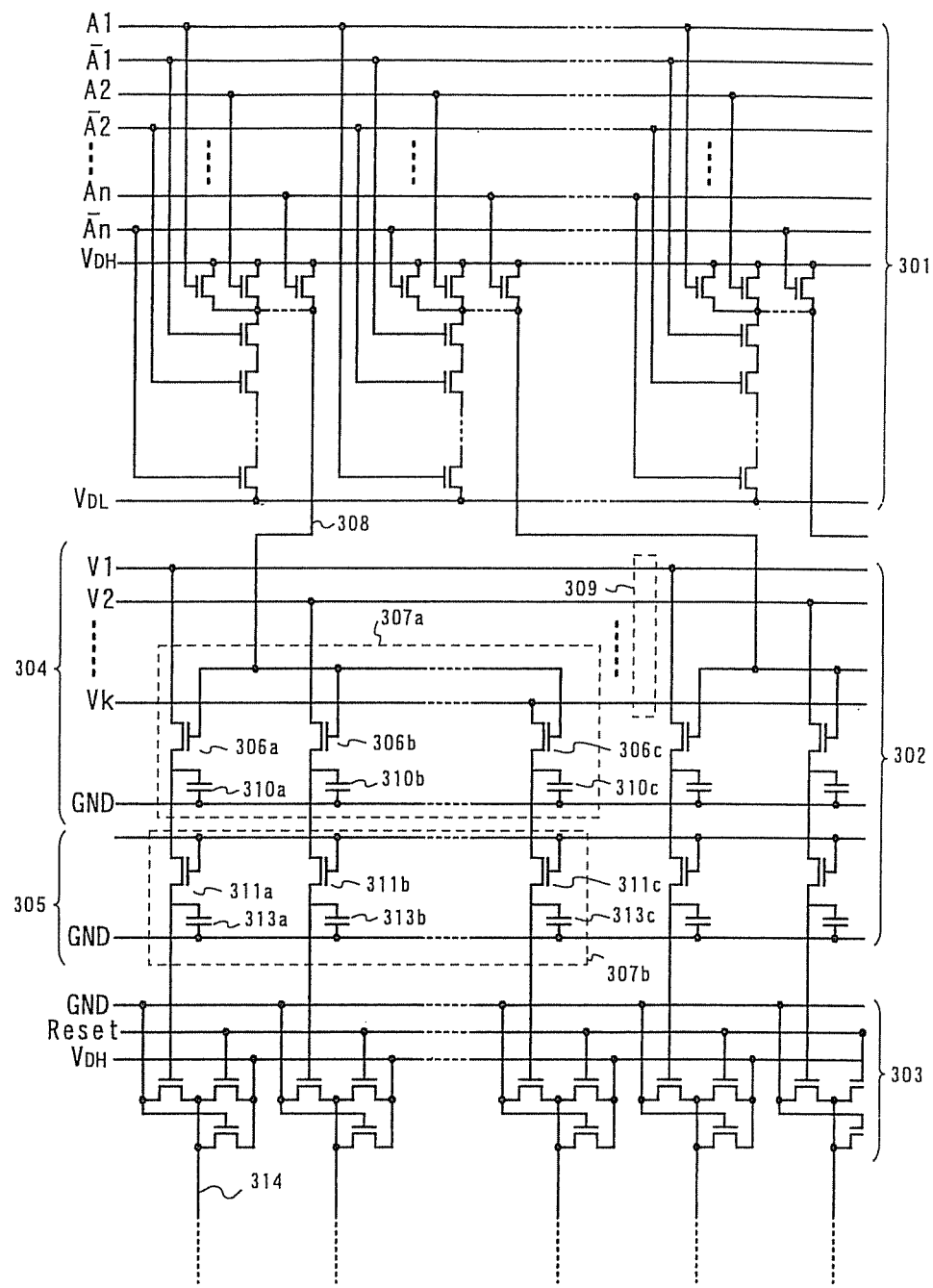
FIG. 3 shows a structure of a source-side driver circuit.

With the gate-side driver circuit that operates in the above-described manner, the gate wirings are sequentially selected. Then, the structure of a source-side driver circuit is shown in FIG. 3. The source-side driver circuit as shown in FIG. 3 includes a decoder 301, a latch 302, and a buffer 303. Since the decoder 301 and the buffer 303 have the identical structures with those of the gate-side driver circuit, respectively, descriptions therefor are omitted here.

In the case of the source-side driver circuit shown in FIG. 3, the latch 302 is composed of a first-stage latch 304 and a second-stage latch 305. Each of the first-stage latch 304 and the second-stage latch 305 includes a plurality of basic units 307 each composed of m p-channel TFTs 306a to 306c. An output line 308 from the decoder 301 is input to gates of the respective m p-channel TFTs 306a to 306c that form the basic unit 307. It should be noted that the number m is any integer.

For example, in the case of the VGA display, the number of the source wirings is 640. In the case where m=1, the number of the NAND circuits required to be provided is also 640, while 20 selection lines (corresponding to 10 bits) are required to be provided. On the other hand, however, when m=8, the number of the necessary NAND circuits is 80 and the number of the necessary selection lines is 14 (corresponding to 7 bits). Namely, assuming that the number of the source wirings is M, the number of necessary NAND circuits can be expressed as M/m.

Sources of the p-channel TFTs 306a to 306c are connected to video signal lines (V1, V2, . . . , Vk) 309, respectively. Namely, when a negative voltage is applied to an output line 308, all of the p-channel TFTs 306a to 306c are simultaneously put into the ON state, so that video signals are taken into the corresponding p-channel TFTs 306a to 306c, respectively. The video signals thus taken in are retained in capacitors 310a to 310c, respectively, connected thereto.

Furthermore, the second-stage latch 305 also includes a plurality of basic units 307b each composed of m p-channel TFTs 311a to 311c. All of gates of the p-channel TFTs 311a to 311c are connected to a latch signal line 312, so that when a negative voltage is applied to the latch signal line 312, all of the p-channel TFTs 311a to 311c are simultaneously turned on.

As a result, the signals retained in the capacitors 310a to 310c are then retained respectively in capacitors 313a to 313c connected to the p-channel TFTs 311a to 311c, and simultaneously output to the buffer 303. Then, as described with reference to FIG. 1, those signals are output to the source wirings 314 via the buffer. With the source-side driver circuit that operates in the above-described manner, the source wirings are sequentially selected.

As described in the above, by composing the gate-side driver circuit and the source-side driver circuit only of the p-channel TFTs, all of the pixel sections and the driver circuits can be entirely formed of the p-channel TFTs. Accordingly, upon fabrication of an active-matrix type display device, a fabrication yield and a throughput of the TFT steps can be significantly improved, thereby resulting in a reduced fabrication cost.

It should be noted that the present invention can be embodied even in the case where either of the source-side driver circuit or the gate-side driver circuit, or both of them, are provided in an IC chip to be externally attached.

Embodiment 1

In the present invention, the pixel section, in addition to the driver circuit, is entirely composed of the p-channel TFTs. Thus, in the present embodiment, the structure of the pixel section for displaying an image in accordance with the signals transmitted by the driver circuit as shown in FIGS. 1 and 3 will be described.

Figure 5:
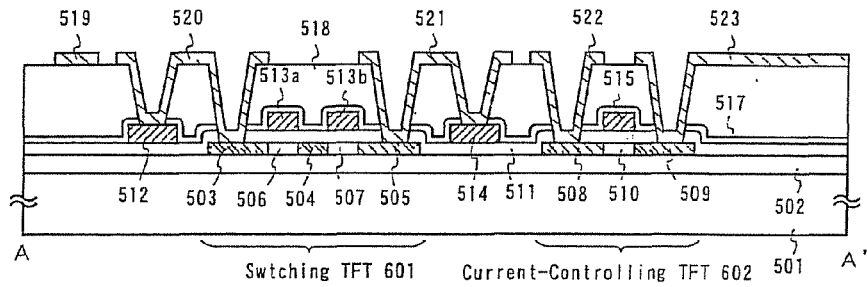
FIG. 5 shows a cross-sectional structure of the pixel section of the light-emitting device.
Figure 6:
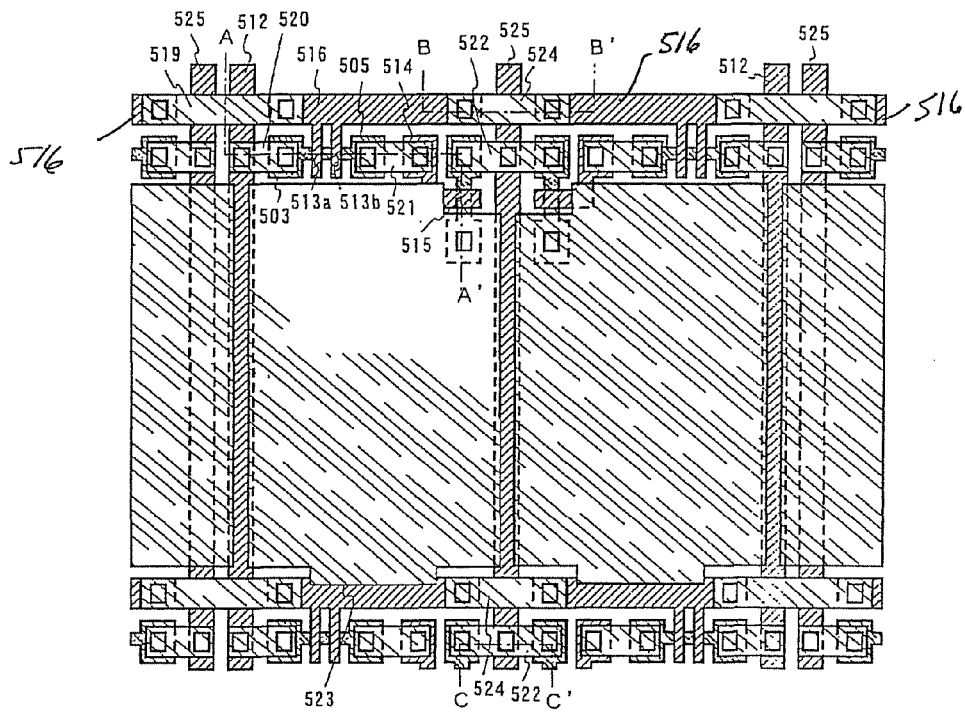
FIG. 6 shows a top-view structure of the pixel section of the light-emitting device.

The structure of a pixel of an active-matrix type light-emitting device in accordance with the present invention is shown in FIGS. 5 and 6. FIG. 5 illustrates a cross-sectional view of one pixel, while FIG. 6 illustrates a top view of adjacent two pixels. FIG. 5 shows a cross-sectional view cut along A-A' in FIG. 6, and the same component is designated with the same reference numeral in both of these figures. In addition, the two pixels illustrated in FIG. 6 are symmetric to each other with respect to the current supply line 525, and therefore, have the same structure as each other.

In FIG. 5, reference numeral 501 denotes a substrate transparent to visible light, and 502 denotes an insulating film containing silicon. As the substrate 501 that is transparent to visible light, a glass substrate, a quartz substrate, a crystalline glass substrate, or a plastic substrate (including a plastic film) can be used. As the insulating film 502 containing silicon, a silicon oxide film, a silicon oxynitride film, or a silicon nitride film can be used.

In the present specification, TFTs are formed on an insulating surface. As the insulating surface, an insulating film (typically an insulating film containing silicon) or a substrate made of an insulating body (typically a quartz substrate) may be used. Accordingly, the expression "on the insulating surface" means "on the insulating film" or "on the substrate made of the insulating material".

On the insulating film 502 containing silicon, a switching TFT 601 and a current-controlling TFT 602 are formed with p-channel TFTs.

The switching TFT 601 employs, as an active layer, a semiconductor region that includes regions 503 to 505 made of p-type semiconductor (hereinafter referred to as the p-type semiconductor regions) and regions 506 and 507 made of intrinsic or substantially intrinsic semiconductor (hereinafter referred to as the channel formation regions). On the other hand, the current-controlling TFT 602 employs, as an active layer, a semiconductor region including p-type semiconductor regions 508 and 509 and a channel formation region 510.

The p-type semiconductor region 503 or 505 serves as a source region or a drain region of the switching TFT 601. Furthermore, the p-type semiconductor region 508 serves as a source region of the current-controlling TFT 602, while the p-type semiconductor region 509 serves as a drain region of the current-controlling TFT 602.

The active layers of the switching TFT 601 and the current-controlling TFT 602 are covered with a gate insulating film 511, and further thereon, a source wiring 512, a gate electrode 513a, a gate electrode 513b, a drain wiring 514, and a gate electrode 515 are formed. These components are simultaneously formed with the identical material. As the constituent material for these lines or electrodes, tantalum, tungsten, molybdenum, niobium, titanium, or a nitride of these metals may be used. Alternatively, an alloy in which these metals are combined, or a suicide of these metals, may be used.

Furthermore, as shown in FIG. 6, the drain wiring 514 is integrated with the gate electrode 515. In addition, the gate electrodes 513a and 513b are integrated with the shared gate wiring 516, so that the same voltage is always being applied to these gate electrodes 513a and 513b.

Moreover, in FIG. 5, reference numeral 517 denotes a passivation film made of a silicon oxynitride film or a silicon nitride film, and an interlayer insulating film 518 is formed thereon. As the interlayer insulating film 518, an insulating film containing silicon or an organic resin film is used. As the organic resin film, a polyimide film, a polyamide film, an acrylic resin film, or a BCB (benzocyclobutene) film can be used.

Further on the interlayer insulating film 518, connecting wirings 519 to 522 and an electrode 523 made of a transparent conductive film are formed. At the same time, line 524 as shown in FIG. 6 are also simultaneously formed. As the transparent conductive film, a thin film made of indium oxide, tin oxide, zinc oxide, a compound of indium oxide and tin oxide, a compound of indium oxide and zinc oxide, or a compound obtainable by adding gallium to these materials can be used.

In this case, the connecting wiring 520 is a line that provides electrical connection between the source wiring 512 and the p-type semiconductor region 503, while the connecting wiring 521 is a line that provides electrical connection between the p-type semiconductor region 505 and the drain region 514. Moreover, the connecting wiring 522 is a line that provides electrical connection between the source region 508 and the current supply line (see FIG. 6) 525.

The connecting wiring 519 is a line that realizes connections among the gate wirings 516 divided and formed into a plurality of patterns, and is provided to overpass the source wiring 512 and the current supply line 525. It is also possible to connect the source wiring or the current supply line, divided into a plurality of portions, with the connecting wiring formed so as to overpass the gate wiring.

An electrode 523 is an anode of the EL element, and is referred to as the pixel electrode or the anode in the present specification. The pixel electrode 523 is electrically connected to a drain region 509 of the current-controlling TFT 602. In FIG. 6, the pixel electrode 523 can be considered as a drain wiring of the current-controlling TFT 602.

Figure 7A:
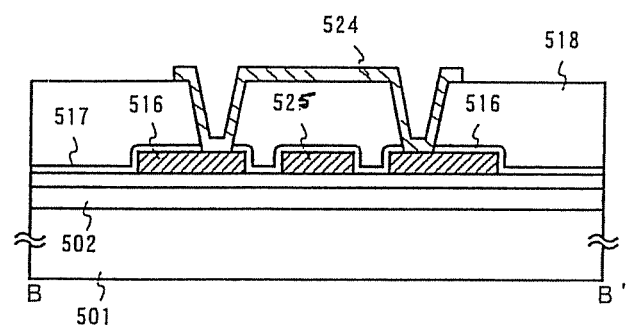
FIGS. 7(A) and 7(B) each show another cross-sectional structure of the pixel section of the light-emitting device.
Figure 7B:
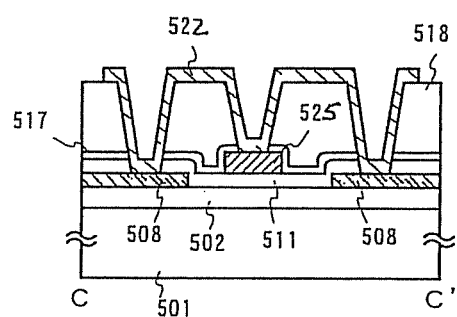

FIG. 7(A) shows a cross-sectional view obtainable by cutting FIG. 6 along B-B'. As shown in FIG. 7(A), the connecting wiring 524 overpasses the current supply line 525 and provides connection among the gate wirings 516. In addition, FIG. 7(B) shows a cross-sectional view obtainable by cutting FIG. 6 along C-C'. As shown in FIG. 7(B), the connecting wiring 522 electrically connects the p-type semiconductor region 508 of the current-controlling TFT 602 with the current supply line 525.

In the actual device, an EL layer (not shown) and a cathode (not shown) are formed thereafter on the pixel electrode 523 to complete an active-matrix type light-emitting device. The EL layer and the cathode may be formed with any known technique.

Furthermore, although a TFT having a top-gate structure (specifically, a planar-type TFT) has been described as an example in the above, the present invention is not limited to such a kind of TFT structure. Alternatively, the present invention can be applied to a TFT having a bottom-gate structure. Typically, it is possible to embody the present invention in a reverse-staggered type TFT.

With the pixel structure as described in the above, the fabrication process for the active-matrix type light-emitting device can be significantly simplified, and an inexpensive active-matrix type light-emitting device can be produced. In addition, an electrical apparatus that employs the same as a display section can be realized.

Embodiment 2

In the present embodiment, the fabrication process of an active-matrix type light-emitting device in which a pixel section and a driver circuit for transmitting a signal to the pixel section are formed on the identical insulating surface will be described with reference to FIGS. 8(A) to 8(D) and FIGS. 9(A) to 9(C).

First, as shown in FIG. 8(A), an underlying film (insulating body) 802 is formed on a glass substrate 801. In the present embodiment, the underlying film 802 is formed by sequentially depositing a first silicon oxynitride film having a thickness of 50 nm and a second silicon oxynitride film having a thickness of 200 nm in this order from the side closer to the glass substrate 801. The nitrogen content of the first silicon oxynitride film is larger than that of the second silicon oxynitride film so as to suppress diffusion of alkali metal from the glass substrate 801.

Then, an amorphous silicon film (not shown) is formed on the underlying film 802 by a plasma CVD method to have a thickness of 40 nm. Thereafter, the amorphous silicon film is irradiated with laser light for crystallization to form a polycrystalline silicon film (polysilicon film) 803. It should be noted that a microcrystalline silicon film or an amorphous silicon germanium film may be formed instead of the amorphous silicon film. Moreover, a method for crystallization is not limited to the laser crystallization method, but any other known crystallization method can be used.

Then, as shown in FIG. 8(B), the polycrystalline silicon film 803 is patterned to form respective independently isolated semiconductor layers 804 to 806. Upon completion, the semiconductor layer denoted with reference numeral 804 becomes an active layer of a TFT that forms a driver circuit (this TFT is referred to as driver TFT). On the other hand, the semiconductor layer denoted with reference numeral 805 becomes an active layer of the switching TFT, while that denoted with reference numeral 806 denotes an active layer of the current-controlling TFT.

Thereafter, a gate insulating film 807 with a thickness of 80 nm, made of a silicon oxide film, is formed by a plasma CVD method so as to cover the isolated semiconductor layers 804 to 806. Furthermore, a tungsten film (not shown) is formed by a sputtering method on the gate insulating film 807 to have a thickness of 350 nm, and is then patterned to form gate electrodes 808, 809, 810a, and 810b. Simultaneously, a source wiring 812 and a drain wiring 813 of the switching TFT are formed. Of course, the drain wiring 813 and the gate electrode 811 are formed integrally.

Then, elements belonging to Group 13 in the periodic table are added with the gate electrodes 808, 809, 810a, 810b, the source wiring 812 and the drain wiring 813 being used as a mask. Any known methods may be used for the above purpose. In the present embodiment, boron is added by a plasma doping method at the concentration in the range of $5 \times 10^{19}$ to $1 \times 10^{21}$ atoms/cm$^3$. Thus, the semiconductor regions with the p-type conductivity (hereinafter referred to as the p-type semiconductor regions) 814 to 821 are formed. Furthermore, channel formation regions 822 to 826 are formed immediately below the gate electrodes 808, 809, 810a, and 810b.

It should be noted that in the present embodiment, the p-type semiconductor regions 814 and 816 serve as source regions of the p-channel TFTs forming the driver circuit, while the p-type semiconductor region 815 serves as a drain region of the p-channel TFT forming the driver circuit.

Thereafter, a heat treatment is performed to activate the elements in the Group 13 of the periodic table contained in the p-type semiconductor regions. This activation process may be performed by either one of a furnace annealing method, a laser annealing method, and a lamp annealing method, or any combination thereof. In the present embodiment, a heat treatment is performed at 500° C. for four (4) hours in nitrogen atmosphere. In this case, it is preferable to reduce the concentration of oxygen in the nitrogen atmosphere to as low a level as possible. The active layers of the TFTs are formed by the above activation process.

After the activation process is completed, a silicon oxynitride film with a thickness of 200 nm is formed as a passivation film 827, and a hydrogenation process for the semiconductor layers is then performed. Any known hydrogen annealing technique or a plasma hydrogenation technique may be used for the hydrogenation process. Thus, the structure as shown in FIG. 8(C) can be obtained.

Thereafter, as shown in FIG. 8(D), an interlayer insulating film 828 made of a resin is formed to have a thickness of 800 nm. As the resin for this purpose, polyimide, polyamide, acrylic resin, epoxy resin, or BCB (benzocyclobutene) may be used. Alternatively, an inorganic insulating film may be also used.

Contact holes are then formed in the interlayer insulating film 828, and connecting wirings 829 to 835 and a pixel electrode 836 are formed. In the present embodiment, a conductive film made of a compound of indium oxide and tin oxide (Indium Tin Oxide; ITO) is used for forming the connecting wirings 829 to 835 and the pixel electrode 836. It should be noted that of course, any conductive films made of other materials that are transparent to visible light can be used for this purpose.

The connecting wirings 829 and 831 serve as source wirings of the p-channel TFTs forming the driver circuit, while the connecting wiring 830 serves as a drain wiring of the p-channel TFT forming the driver circuit. Thus, in the present embodiment, the driver circuit is formed based on a PMOS circuit which is formed of p-channel TFTs.

In the above-described state, the p-channel TFTs forming the driver circuit as well as the switching TFT and the current-controlling TFT in the pixel section are completed. In the present embodiment, all of the TFTs are of the p-channel type. It should be noted that the switching TFT is formed such that the gate electrode thereof overpasses the active layer at two different positions so that the two channel formation regions are connected to each other in series. Such a structure can effectively suppress an OFF current value (i.e., a current that flows when a TFT is in the OFF state).

Then, as shown in FIG. 9(A), insulating bodies 837 and 838 made of a resin are formed so as to cover edge portions and concave portions (recesses formed due to the contact holes) of the pixel electrode 836. These insulating bodies 837 and 838 may be formed by forming an insulating film made of a resin and then patterning the film. In this case, it is desirable to set a height (d) from the surface of the pixel electrode 836 to the top of the insulating body 838 to be at 300 nm or less (preferably 200 nm or less). It should be noted that the insulating bodies 837 and 838 may be omitted.

The insulating body 837 is formed for the purpose of covering the edge portions of the pixel electrode 836 and thereby avoiding an adverse effect of electric field concentration at the edge portions. Thus, deterioration of the EL layer can be prevented. On the other hand, the insulating body 838 is formed for the purpose of burying the concave portions of the pixel electrode which are formed due to the contact holes. Thus, any coverage defect of the EL layer to be later formed can be prevented, and any short-circuit between the pixel electrode and a cathode to be later formed can be prevented.

Thereafter, an EL layer 839 with a thickness of 70 nm and a cathode 840 with a thickness of 300 nm are formed by a vapor deposition method. In the structure of the present embodiment, a copper phthalocyanine layer (hole injection layer) with a thickness of 20 nm and an Alq$_3$ layer (light-emitting layer) with a thickness of 50 nm are formed as the EL layer 839. It should be noted that any other known structure in which a hole injection layer, a hole transport layer, an electron transport layer or an electron injection layer are combined may be used for the light-emitting layer.

In the present embodiment, the copper phthalocyanine layer is first formed to cover all of the pixel electrodes, and thereafter, a red-color light-emitting layer, a green-color light-emitting layer, or a blue-color light-emitting layer are formed for each of the pixels corresponding to red, green and blue colors, respectively. The regions to which the layer is to be formed may be selected upon vapor deposition by means of a shadow mask. Thus, a color display can be realized.

When the green-color light-emitting layer is to be formed, Alq₃ (tris-8-quinolinolato aluminum complex) is used as a mother material of the light-emitting layer, and quinacridon or coumarine 6 is used as a dopant. When the red-color light-emitting layer is to be formed, Alq₃ is used as a mother material of the light-emitting layer, and DCJT, DCM1, or DCM2 is used as a dopant. When the blue-color light-emitting layer is to be formed, BAlq₃ (a complex with five coordinations having a mixed ligand of 2-methyl-8-quinolinol and phenol derivative) is used as a mother material of the light-emitting layer, and perylene is used as a dopant.

It should be noted that the present invention is not limited to use of the above-mentioned organic materials, but rather, any known low-molecule type organic EL material, high-molecule type organic EL material, or inorganic EL material can be used. Alternatively, any combination of these materials can be also used. Furthermore, in the case where a high-molecule type organic EL material is used, a coating method can be used.

In the manner as mentioned in the above, the EL element composed of pixel electrode (anode) 836, EL layer 839 and cathode 840 is formed (see FIG. 9(B)).

Thereafter, a cover member 842 is bonded by means of an adhesive 841. In the present embodiment, a glass substrate is used as the cover member 842. Alternatively, a flexible plastic film, a quartz substrate, a plastic substrate, a metal substrate, a silicon substrate, or a ceramic substrate may be used. It is advantageous to provide an insulating film containing silicon or a carbon film on a surface exposed to the surrounding air so as to prevent oxygen or water from entering or to provide protection against scratches caused by friction.

As the adhesive 841, a UV curable resin or a thermosetting resin is typically used. For example, PVC (polyvinyl chloride), acrylic resin, polyimide, epoxy resin, silicone resin, PVB (polyvinyl butyral), or EVA (ethylene vinyl acetate) can be used. In the case where the adhesive 841 is positioned in the side closer to an observer when viewed from the EL element, the adhesive is required to be made of a material that allows light to pass therethrough. In addition, it is advantageous to provide a water-absorbing material (preferably barium oxide) and/or an anti-oxidization material (i.e., a substance that adsorbs oxygen) within the adhesive 841 for preventing deterioration of the EL element.

With the above-described structure, the EL element can be completely shut out from the ambient air. Thus, deterioration of the EL material due to oxidation can be substantially completely suppressed, so that reliability of the resultant EL element can be significantly improved.

Figure 10:
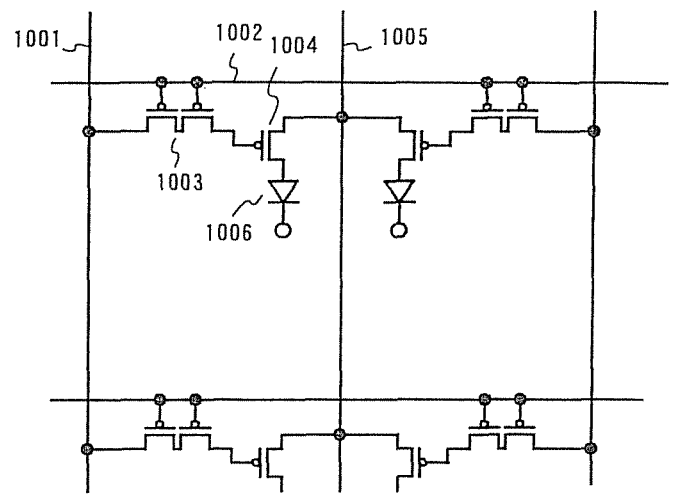
FIG. 10 shows another circuit structure of a pixel section of a light-emitting device.

The active-matrix type light-emitting device thus fabricated in the above-described manner has the pixel section that includes the circuit structure as shown in FIG. 10. Specifically, in FIG. 10, reference numeral 1001 denotes a source wiring, 1002 denotes a gate wiring, 1003 denotes a switching TFT. 1004 denotes a current-controlling TFT, 1005 denotes a current supply line, and 1006 denotes an EL element. In the present embodiment, each of the switching TFT 1003 and the current-controlling TFT 1004 is formed as the p-channel TFT.

Figure 4:
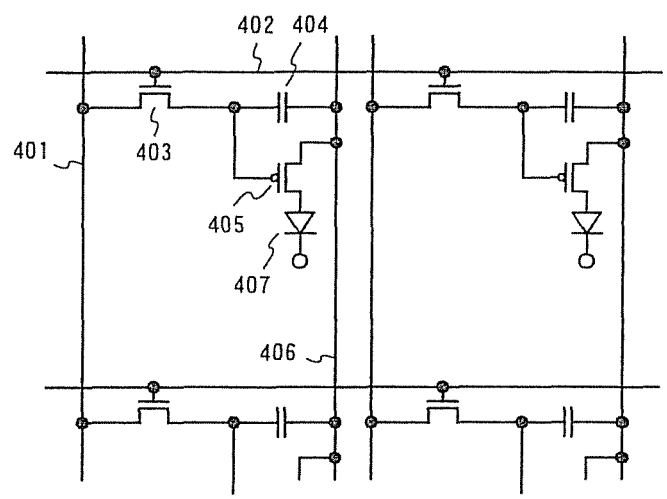
FIG. 4 shows a circuit structure of a pixel section of a light-emitting device.

It should be noted that a gate capacitance of the current-controlling TFT 1004 exhibits the same function as the capacitor employed in the conventional art (i.e., the capacitor 404 in FIG. 4). This can be realized because in the case where a time-divisional grayscale display is performed by means of a digital driving scheme, necessary charges can be retained only by the gate capacitance of the current-controlling TFT since one-frame period (or one-field period) is short.

The active-matrix type light-emitting device of the present invention as described in the above requires only five masks in total for performing the patterning steps (this number can be further reduced to four when the insulating bodies 837 and 838 are omitted), which can in turn realize a high fabrication yield and a low fabrication cost.

Embodiment 3

Figure 11:
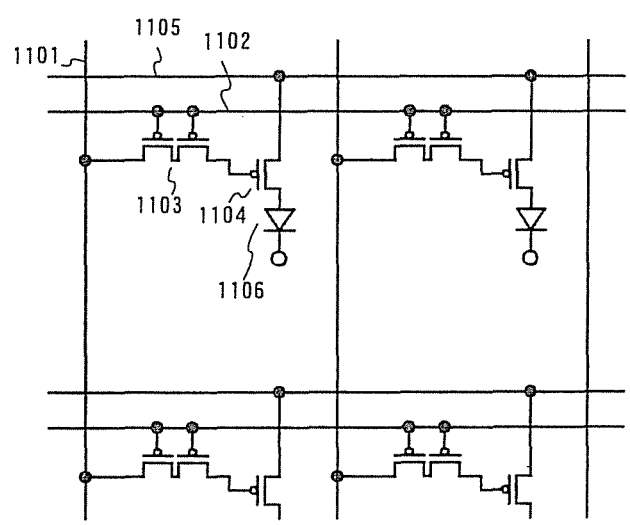
FIG. 11 shows yet another circuit structure of a pixel section of a light-emitting device.

In Embodiment 2 mentioned in the above, the circuit structure of the pixel section shown in FIG. 10 can be modified as shown in FIG. 11. Specifically, in FIG. 11, reference numeral 1101 denotes a source wiring, 1102 denotes a gate wiring, 1103 denotes a switching TFT, 1104 denotes a current-controlling TFT, 1105 denotes a current supply line, and 1106 denotes an EL element. In the present embodiment, each of the switching TFT 1103 and the current-controlling TFT 1104 is formed as the p-channel TFT.

In this case, since the gate wiring 1102 and the current supply line 1105 are disposed in different layers, it is advantageous to provide these components so as to overlap each other with an interlayer insulating film interposed therebetween. Thus, an occupied area of these lines can be substantially made common, and therefore, the effective light-emission area of the pixel can be increased.

Embodiment 4

In the present embodiment, the active-matrix type light-emitting device is fabricated in the manner different from that described in Embodiment 1. The fabrication process will be described below with reference to FIGS. 12(A) to 12(C).

First, the fabrication steps up to the one as shown in FIG. 8(D) are performed as described previously in connection with Embodiment 2 to form connecting wirings 1201 to 1207 and a drain wiring 1208. In the present embodiment, these connecting wirings are formed of a metal film. Although any material can be used as the metal film, a layered film having a three-layer structure in which an aluminum film is sandwiched between titanium films is employed in the present embodiment.

Figure 13:
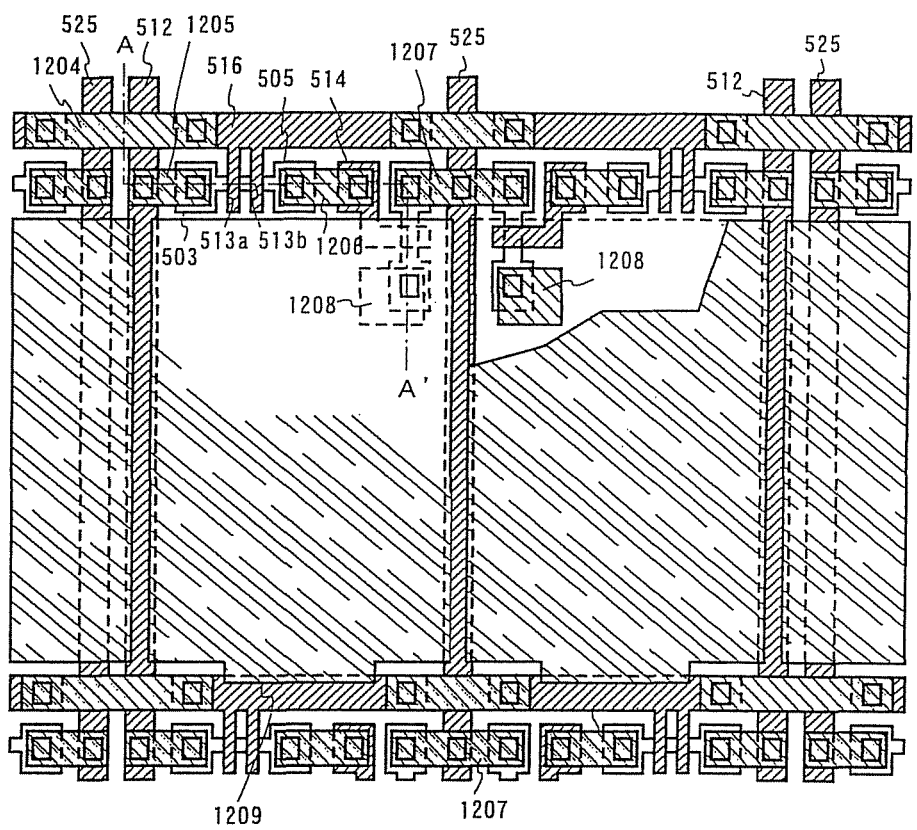
FIG. 13 shows another top-view structure of the pixel section of the light-emitting device.

Then, as shown in FIG. 12(B), a pixel electrode 1209 made of a transparent conductive film is formed. In this case, the pixel electrode 1209 is formed such that a portion thereof comes into contact with the drain wiring 1208. The current-controlling TFT and the pixel electrode can be thus electrically connected to each other. FIG. 13 shows a top view in the above-described structure. It should be noted that the cross-sectional view shown in FIG. 12(B) is obtainable by cutting FIG. 13 along A-A'.

In the present embodiment, the connecting wirings 1201 to 1207 can be made of a metal film. Accordingly, as compared to the transparent conducting film such as an ITO film or the like described in the previous embodiment modes, a reduction in a wiring resistance as well as a reduction in a contact resistance can be realized. Moreover, all of the lines for connecting various circuit portions in the driver circuit can be made of a low-resistance metal film, and therefore, a driver circuit capable of exhibiting a higher operating speed can be realized.

Although the pixel electrode 1209 is formed after the connecting wirings 1201 to 1207 and the drain wiring 1208 are completed, this fabrication order may be reversed. In other word, the connecting wirings and the drain wiring made of a metal film may be formed after the pixel electrode made of a transparent conductive film is formed.

Thereafter, as in Embodiment 2, an insulating body 1210 made of a resin is formed, and an EL layer 1211 and a cathode 1212 are sequentially formed. Furthermore, a cover member 1214 is formed with an adhesive 1213. Thus, the active-matrix type light-emitting device as shown in FIG. 12(C) is completed.

Embodiment 5

In the present embodiment, an example of fabricating the active-matrix type light-emitting device in accordance with the present invention with a plastic substrate or a plastic film will be explained. Plastics that can be used in the present embodiment include PES (polyethylene sulfile), PC (polycarbonate), PET (polyethylene terephthalate), or PEN (polyethylene naphthalate).

First, the TFTs and the EL element are formed on the glass substrate 801 in accordance with the fabrication steps as described in Embodiment 2. In the present embodiment, however, a peeling layer 1401 is formed between the glass substrate 801 and the underlying film 802. A semiconductor film can be used as the peeling layer 1401. Typically, an amorphous silicon film may be used for the above purpose.

Moreover, in the present embodiment, a cover member 1403 is adhered by means of a first adhesive 1402. An insulating film made of a resin (typically, polyimide, acrylic resin, polyamide, or epoxy resin) is used as the first adhesive 1402. It should be noted that the material for the first adhesive 1402 is required to realize a sufficient selection ratio upon etching of the peeling layer 1401 by means of a gas containing halogen fluoride. As the cover member 1403 to be adhered with the first adhesive 1402, a PET film is used in the present embodiment.

Then, the entire substrate on which the element has been formed is exposed to the gas containing halogen fluoride. This treatment allows the peeling layer 1401 to be selectively removed. Halogen fluoride refers to a substance that can be expressed as the chemical formula of XFn (where X indicates a halogen other than fluorine, and n is an integer). For example, as the halogen fluoride, chlorine monofluoride (ClF), chlorine trifluoride ($ClF_3$), bromine monofluoride (BrF), bromine trifluoride (BrF), iodine monofluoride (IF), iodine trifluoride ($IF_3$) can be used.

Halogen fluoride exhibits a large selection ratio between a silicon film and a silicon oxide film, thereby resulting in a selective etching of the silicon film being realized. Furthermore, this etching reaction can easily proceed at room temperature, and therefore, the process can be performed even after the EL element with low heat-resistance capability is formed.

Although the silicon film can be etched only by being exposed to the above-mentioned halogen fluoride, other fluorides (carbon tetrafluoride ($CF_4$) or nitrogen trifluoride) may be used in the present invention so long as they are put into a plasma condition.

In the present embodiment, chlorine trifluoride ($ClF_3$) is used as halogen fluoride and nitrogen is used for a dilution gas. Argon, helium, or neon may be used as the dilution gas. Flow rates of both of the gases may be set at 500 sccm ($8.35 \times 10^{-6}$ m$^3$/s) and a reaction pressure may be set in the range from 1 to 10 Torr ($1.3 \times 10^2$ to $1.3 \times 10^3$ Pa). Moreover, a treatment temperature may be set at room temperature (typically in the range from 20 to 27° C.).

Figure 14A:
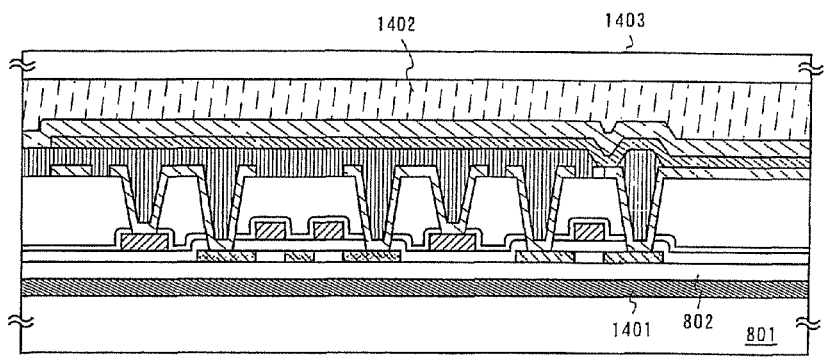
FIGS. 14(A) through 14(C) show various fabrication steps of the light-emitting device.
Figure 14B:
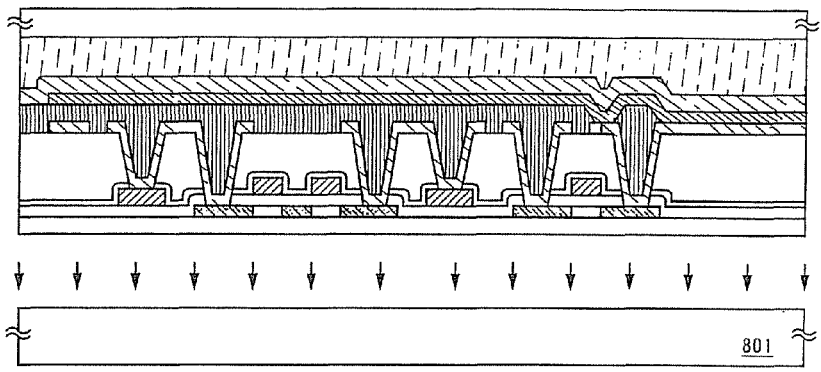
Figure 14C:
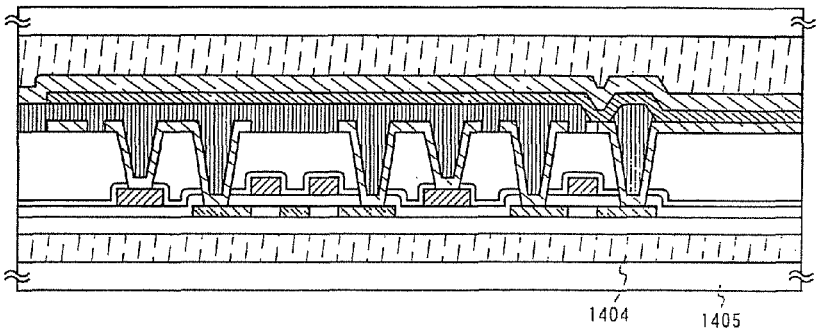

Thereafter, as shown in FIG. 14(C), a substrate (bonding substrate) 1405 made of a plastic substrate or a plastic resin is adhered by means of a second adhesive 1404. In the present embodiment, a PET film is used as the bonding substrate 1405. It is desirable for the cover member 1403 and the bonding substrate 1405 to be made of the same material as each other in order to satisfy a stress balance condition.

Thus, the active-matrix type light-emitting device in which the TFTs and the EL element are sandwiched by the plastic film can be obtained. Since the plastic film is bonded after the TFTs are formed in the present embodiment, no limitation is applied onto the fabrication process. For example, the TFTs can be formed without taking the heat-resistance capability of the plastic to be employed into consideration.

Furthermore, since a flexible, light-weighted light-emitting device can be obtained, the device in the present embodiment is suitable to a display section of portable information equipment such as a mobile phone, an electronic databook or the like.

The structure as described in the present embodiment can be freely combined with any structures in Embodiments 1 through 4.

Embodiment 6

In the present invention, it is advantageous to provide a DLC (diamond-like carbon) film on one side or both sides of the substrate or the cover member on which the TFTs and the EL element are to be formed. It should be noted that a thickness of such a DLC film is desirably not greater than 50 nm (more preferably in the range of 10 to 20 nm) since too large a thickness thereof causes transmittance of the film to be reduced. In addition, the DLC film may be formed by a sputtering method or an ECR plasma CVD method.

The DLC film is characterized by the Raman spectrum distribution including an asymmetric peak at around 1550 cm$^{-1}$, and a shoulder at around 1300 cm$^{-1}$. Moreover, the DLC film is also characterized by the hardness in the range of 15 to 25 Pa when measured by means of a micro-hardness tester. Furthermore, it is advantageous to provide the DLC film as a protection film for surface protection and/or heat dissipation since the DLC film has a larger hardness and a larger heat conductivity as compared to the substrate or the cover member.

The structure as described in the present embodiment can be freely combined with any structures in Embodiments 1 through 5.

Embodiment 7

Figure 15A:
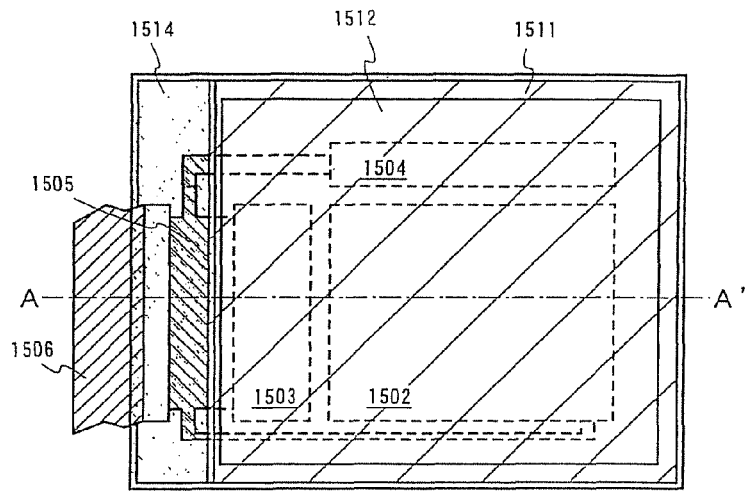
FIG. 15(A) shows yet another top-view structure of the pixel section of the light-emitting device.

In the present embodiment, external appearance views of the light-emitting device of the present invention as described in Embodiment 2 will be described. FIG. 15(A) shows a top view of the light-emitting device of the present invention, while FIG. 15(B) shows a cross-sectional view thereof.

In FIG. 15(A), reference numeral 1501 denotes a substrate, 1502 denotes a pixel section, 1503 denotes a source-side driver circuit, and 1504 denotes a gate-side driver circuit. Each of these driver circuits is connected via a wiring 1505 to an FPC (flexible printed circuit) 1506, which in turn is connected to an external apparatus. The gate-side driver circuit shown in FIG. 1 is used in the gate-side driver circuit 1504 in FIG. 15(A), while the source-side driver circuit shown in FIG. 3 is used in the source-side driver circuit 1503 in FIG. 15(A). Furthermore, the pixel section shown in FIG. 5 is used in the pixel section 1502 in FIG. 15(A). In this case, a first sealing member 1511, a cover member 1512, an adhesive 1513 (see FIG. 15(B)), and a second sealing member 1514 are formed so as to surround the pixel section 1502, the source-side driver circuit 1503, and the gate-side driver circuit 1504.

Figure 15B:
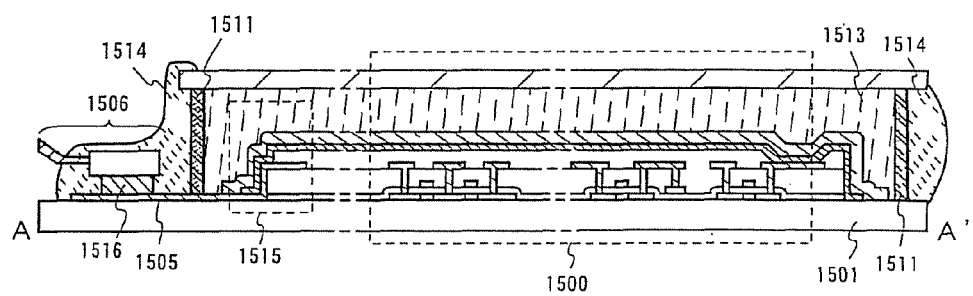
FIG. 15(B) shows yet another cross-sectional structure of the pixel section of the light-emitting device.

FIG. 15(B) corresponds to the cross-sectional view obtainable by cutting FIG. 15(A) along A-A'. In this case, a region surrounded with a dashed line 1500 corresponds to the cross-sectional view shown in FIG. 9(C), and accordingly, any detailed descriptions thereof will be omitted here.

A cathode of the EL element is electrically connected to the wiring 1505 in the region denoted by reference numeral 1514. The wiring 1505 is provided to supply a predetermined voltage to the cathode, and is electrically connected to the FPC 1506 via an anisotropic conductive film 1515. Furthermore, the EL element is surrounded with the first sealing member 1511 and the cover member 1512 which is bonded to the substrate 1501 by the first sealing member 1511. The EL element is encapsulated with an adhesive 1513.

Furthermore, a spacer may be contained in the adhesive 1513. In this case, if the spacer is formed of barium oxide, it is possible to allow the spacer itself to have water-absorbing capability. In the case where the spacer is provided, it is advantageous to provide on a cathode, a resin film as a buffer layer for mitigating a pressure from the spacer.

The wiring 1505 is electrically connected to the FPC 1506 via the anisotropic conductive film 1515. The wiring 1505 transmits to the FPC 1506 the signal to be sent to the pixel section 1502, the source-side driver circuit 1503, and the gate-side driver circuit 1504. The wiring 1505 is electrically connected to the external apparatus by the FPC 1506.

Furthermore, in the present embodiment, the second sealing member 1514 is provided to cover an exposed portion of the first sealing member 1511 and a portion of the FPC 1506, so that the EL element can be completely shut out from the ambient air. The light-emitting device having the cross-sectional structure shown in FIG. 15(B) is thus obtained. The light-emitting device in the present embodiment can be freely combined with any structures in Embodiments 1 through 6.

Embodiment 8

In the present embodiment, the pixel structure of the light-emitting device in accordance with the present invention will be described with reference to FIGS. 16(A) and 16(B). In the present embodiment, reference numeral 1601 denotes a source wiring of a switching TFT 1602, 1603 denotes a gate wiring of the switching TFT 1602, 1604 denotes a current-controlling TFT, 1605 denotes a capacitor (that can be omitted), 1606 denotes a current supply line, 1607 denotes a power source controlling TFT, 1608 denotes an EL element, and 1609 denotes a power source controlling line. In this case, the source wiring 1601, the gate wiring 1603, the current supply line 1606, and the power source controlling line 1608 are formed of the identical conductive film in the same layer.

With respect to operations of the power source controlling TFT 1607, reference can be made to Japanese Patent Application No. 11-341272. It should be noted that in the present embodiment, the power source controlling TFT is formed as the p-channel type that has the structure identical to that of the current-controlling TFT.

Although the power source controlling TFT 1607 is provided between the current-controlling TFT 1604 and the EL element 1608 in the present embodiment, it is also possible to provide the current-controlling TFT 1604 between the power source controlling TFT 1607 and the EL element 1608. Furthermore, the power source controlling TFT 1607 is preferably formed to have the identical structure with the current-controlling TFT 1604, or to be connected in series with the current-controlling TFT 1604 while utilizing the identical active layer thereto.

Figure 16A:
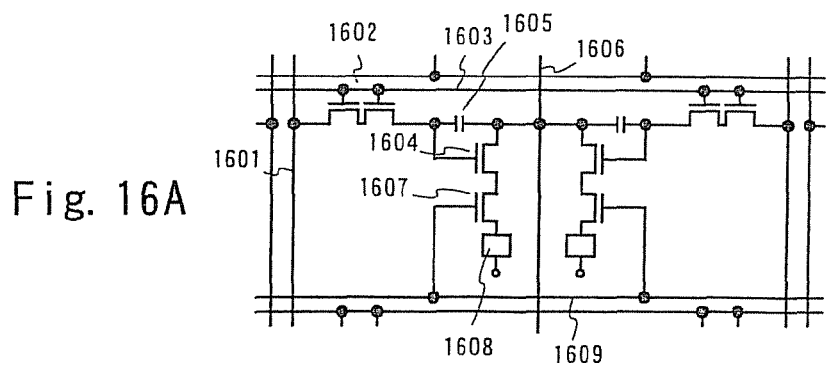
FIGS. 16(A) and 16(B) show yet other circuit structures of a pixel section of a light-emitting device.
Figure 16B:
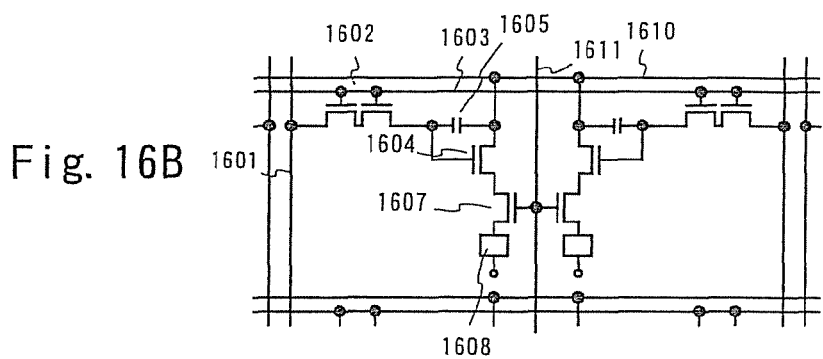

FIG. 16(A) illustrates an example in which the current supply line 1606 is shared with the two pixels. More specifically, the two pixels are formed to be symmetric to each other with respect to the current supply line 1606. In this case, the number of the necessary current supply lines can be reduced, and thus the pixel section can be formed with higher precision. On the other hand, FIG. 16(B) illustrates an example in which the current supply line 1610 is arranged in parallel to the gate wiring 1603, while the current controlling line 1611 is arranged in parallel to the source wiring 1601.

The structure as described in the present embodiment can be freely combined with any structures in Embodiments 1 through 7.

Embodiment 9

In the present embodiment, the pixel structure of the light-emitting device in accordance with the present invention will be described with reference to FIGS. 17(A) and 17(B). In the present embodiment, reference numeral 1701 denotes a source wiring of a switching TFT 1702, 1703 denotes a gate wiring of the switching TFT 1702, 1704 denotes a current-controlling TFT, 1705 denotes a capacitor (that can be omitted), 1706 denotes a current supply line, 1707 denotes an erasing TFT, 1708 denotes an erasing gate wiring, and 1709 denotes an EL element. In this case, the source wiring 1701, the gate wiring 1703, the current supply line 1706, and the erasing gate wiring 1708 are formed of the identical conductive film in the same layer.

With respect to operations of the erasing TFT 1707, reference can be made to Japanese Patent Application No. 11-338786. It should be noted that in the present embodiment, the power source controlling TFT is formed as the p-channel type that has the structure identical to that of the current-controlling TFT. In the above-mentioned Japanese Patent Application No. 11-338786, the erasing gate wiring is referred to as the erasing gate signal line.

A drain of the erasing TFT 1707 is connected to a gate of the current-controlling TFT 1704, so that a gate voltage of the current-controlling TFT 1704 can be forceably changed. It is preferable to form the erasing TFT 1707 as a p-channel TFT that has the same structure as the switching TFT 1702 so that an OFF current can be reduced.

Figure 17A:
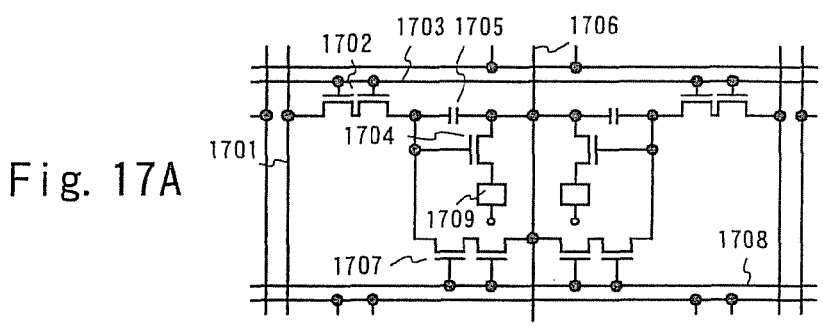
FIGS. 17(A) and 17(B) show yet other circuit structures of a pixel section of a light-emitting device.
Figure 17B:
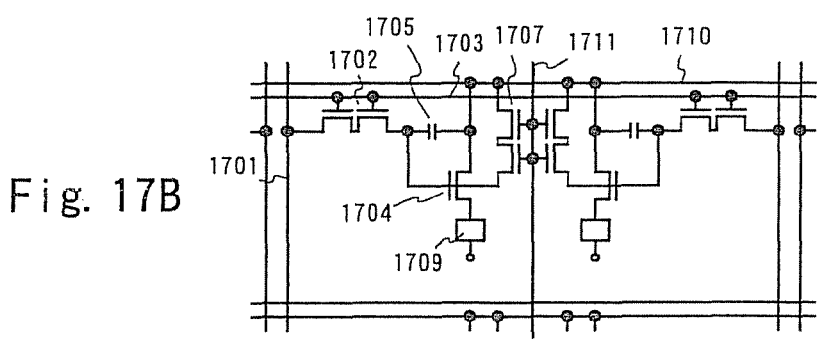

FIG. 17(A) illustrates an example in which the current supply line 1706 is shared between the two pixels. Namely, the two pixels are formed to be symmetric to each other with respect to the current supply line 1706. In this case, the number of the necessary current supply lines can be reduced, and thus the pixel section can be formed with higher precision. On the other hand, FIG. 17(B) illustrates an example in which the current supply line 1710 is arranged in parallel to the gate wiring 1703, while the erasing gate wiring 1711 is arranged in parallel to the source wiring 1701.

The structure as described in the present embodiment can be freely combined with any structures in Embodiments 1 through 7.

Embodiment 10

The light-emitting device in accordance with the present invention may have a structure in which several TFTs are provided in one pixel. Although Embodiments 8 and 9 have described examples in which the three TFTs are provided in one pixel, four through six TFTs may be provided. The present invention is not limited to the pixel structure of the light-emitting device, but can be embodied in other structures.

The structure as described in the present embodiment can be freely combined with any structures in Embodiments 1 through 7.

Embodiment 11

In the present embodiment, a film formation apparatus to be used for forming the EL layer and the cathode will be described with reference to FIG. 18. Specifically, in FIG. 18, reference numeral 1801 denotes a transportation chamber (A) in which a transportation chamber (A) 1802 is provided for realizing transportation of a substrate 1803. The transportation chamber (A) 1801 includes a reduced-pressure atmosphere, and is blocked from other treatment chambers by means of gates. The substrate is passed from the transportation chamber (A) 1801 to the other treatment chambers by means of a transportation mechanism (A) when the corresponding gate is opened.

A cryopump is used to reduce the pressure in the transportation chamber (A) 1801. An exhaust port 1804 is provided on a side surface of the transportation chamber (A) 1801, and the exhaust pump is disposed below the exhaust port 1804. Such a structure realizes an advantage in that a maintenance operation of the exhaust pump can be easily performed.

The respective treatment chambers will be described below. Since the transportation chamber (A) 1801 is provided with the reduced-pressure atmosphere, all of the treatment chambers that are directly coupled thereto are provided with an exhaust pump (not illustrated). As the exhaust pump, an oil rotary pump, a mechanical booster pump, a turbo molecular pump, or a cryopump can be used.

Reference numeral 1805 denotes a stock chamber in which a substrate is set (mounted). This chamber is also referred to as a load-lock chamber. The stock chamber 1805 is shielded from the transportation chamber (A) 1801 by a gate 1800a, and a carrier (not illustrated) to which the substrate 1803 is set is disposed in this chamber 1805. Furthermore, the stock chamber 1805 is provided with the above-mentioned exhaust pump as well as a purge line for introducing a nitrogen gas or an inert gas with high purity to the stock chamber 1805.

In the present embodiment, the substrate 1803 is set onto the carrier with an element formation surface being, faced-down. This is intended to facilitate the face-down orientation when films are formed by a vapor deposition method later. In the face-down orientation, films are formed on the substrate with the element formation surface of the substrate being facing downward. This orientation can suppress attachment of dust on the element formation surface of the substrate.

Reference numeral 1806 denotes a transportation chamber (B), that is coupled to the stock chamber 1805 via a gate 1800b. The transportation chamber (B) 1806 is provided with a transportation mechanism (B) 1807. Reference numeral 1808 denotes a baking chamber (bake chamber), that is coupled to the transportation chamber (B) 1806 via a gate 1800c.

The baking chamber 1808 is provided with a mechanism for inverting the substrate orientation in the upside-down manner. Namely, the substrate that has been transported in the face-down orientation is once changed into a face-up orientation in the baking chamber 1808. This is intended to allow a treatment in the subsequent spin coater chamber 1809 to be performed in the face-up orientation. After the treatment in the spin coater chamber 1809 is completed, the substrate is returned to the baking chamber 1808 to be again inverted upside-down into the face-down orientation, and then further returned to the stock chamber 1805.

The spin coater chamber 1809 is coupled to the transportation chamber (B) 1806 via a gate 1800d. The spin coater chamber 1809 is a film formation chamber for forming a film containing an EL material by applying a solution containing the EL material onto the substrate. In the spin coater chamber 1809, a high-molecule type (polymer type) organic EL material is mainly formed. In this case, the film formation chamber is always filled with an inert gas such as nitrogen or argon. In particular, when a film is formed in the increased-pressure atmosphere at 1 to 5 atoms (preferably 1.5 to 3 atoms), it is possible to effectively prevent oxygen or water from entering the film formation chamber.

The EL material to be formed includes, not only that to be used as a light-emitting layer, but also that to be used as an electron injection layer or an electron transport layer. Any known high-molecule type organic EL material can be also used. Typical organic EL materials for serving as the light-emitting layer include PPV (polyparaphenylene vinylene) derivative, PVK (polyvinyl carbazole) derivative or polyfluorene derivative. These materials are also referred to as n-conjugated polymer. Furthermore, as the electron injection layer, PEDOT (polythiophene) or PAni (polyaniline) can be used.

Reference numeral 1810 denotes a treatment chamber for performing a surface treatment to an anode or a cathode to serve as the pixel electrode of the EL element (hereinafter, this chamber is referred to as the pre-treatment chamber). The pre-treatment chamber 1810 is shielded from the transportation chamber (A) 1801 by a gate 1800e. The pre-treatment chamber can be modified in various manners based on the fabrication process of the EL element to be conducted. In the present embodiment, the pre-treatment chamber 1810 is configured to heat the pixel electrode at 100 to 120 C while irradiating the surface thereof with UV-light. Such a pre-treatment is effective when the anode surface of the EL element is to be processed.

Reference numeral 1811 denotes a vapor deposition chamber for forming the conductive film or the EL material by a vapor deposition method. The vapor deposition chamber 1811 is coupled to the transportation chamber (A) 1801 via a gate 1800f. The vapor deposition chamber 1811 can be provided therein with a plurality of vapor deposition sources. In addition, it is also possible to cause the vapor deposition sources to be evaporated by resistive-heating or electron beams to form the intended film.

The conductive film to be formed in the vapor deposition chamber 1811 is provided as an electrode on the cathode side of the EL element. For this purpose, a metal having a relatively small work function, typically an element belonging to Group 1 or Group 2 in the periodic table (typically, lithium, magnesium, cesium, calcium, potassium, barium, sodium, or beryllium), or a metal having a work function which is close to those thereof can be deposited. Alternatively, aluminum, copper, or silver can be deposited to form a low-resistance conductive film. Furthermore, a conductive film made of a compound of indium oxide and tin oxide, or a conductive film made of a compound of indium oxide and zinc oxide, can be formed by the vapor deposition method as a transparent conductive film.

In the vapor deposition chamber 1811, any known EL materials (in particular, low-molecule type organic EL materials) can be formed. Typical examples for the light-emitting layer include Alq$_3$ (tris-8-quinolinolato aluminum complex) or DSA (distyl allylene derivative), while typical examples for the charge injection layer include CuPc (copper phthalocyanine), LiF (lithium fluoride), or acacK (potassium acetylacetonate). Furthermore, typical examples for the charge transport layer include TPD (triphenylamine derivative) or NPD (anthracene derivative).

In addition, it is also possible to perform co-vapor deposition of the above-mentioned EL material and a fluorescent material (typically, coumarine 6, rubrene, Nile red, DCM, quinacridon, or the like). As the fluorescent material, any known materials may be used. Moreover, it is also possible to perform co-vapor deposition of the EL material and an element belonging to Group 1 or Group 2 in the periodic table, so that a portion of the light-emitting layer can exhibit a function as the charge transport layer or the charge injection layer. The term co-vapor deposition refers to a vapor deposition method in which a plurality of vapor deposition sources are simultaneously heated to mix different materials with each other during the film formation stage.

In either case, the vapor deposition chamber 1811 is shielded from the transportation chamber (A) 1801 by means of the gate 1800f, and the film formation of the EL material or the conductive film can be performed in vacuum. The film formation is performed with the face-down orientation.

Reference numeral 1812 denotes an encapsulation chamber (also referred to as the sealing chamber or the grove box), that is coupled to the transportation chamber (A) 1801 via a gate 1800g. In the encapsulation chamber 1812, a process for finally sealing the EL element into a closed space is performed. This process is intended to provide the formed EL element with protection against oxygen or water. For this purpose, the EL element is mechanically sealed by means of the cover member. Alternatively, it is also possible to seal the EL element by means of a thermosetting resin or a UV-curable resin.

The cover member is adhered to the substrate with the EL element formed thereon by means of the thermosetting resin or the UV-curable resin. The resin is cured through a heat treatment or a UV irradiation process to form a closed space.

In the film formation apparatus shown in FIG. 18, a mechanism 1813 for UV irradiation is provided within the encapsulation chamber 1812 (such a mechanism is referred to as the UV irradiation mechanism 1813 hereinafter). Thus, the UV curable resin is allowed to be cured by UV light emitted from this UV irradiation mechanism 1813. The inner pressure of the encapsulation chamber 1812 may be reduced by providing an exhaust pump, or increased while purging the inner space with a nitrogen gas or an inert gas having high purity.

A receiving chamber (path box) 1814 is coupled to the encapsulation chamber 1812. The receiving chamber 1814 is provided with a transportation mechanism (C) 1815 for transporting to the receiving chamber 1814 the substrate for which the encapsulation of the EL element is completed in the encapsulation chamber 1812. The inner pressure of the receiving chamber 1814 can be also reduced by providing an exhaust pump. The receiving chamber 1814 is intended to prevent the encapsulation chamber 1812 from being directly exposed to the ambient air, and the substrate is taken out from the receiving chamber 1814.

Figure 18:
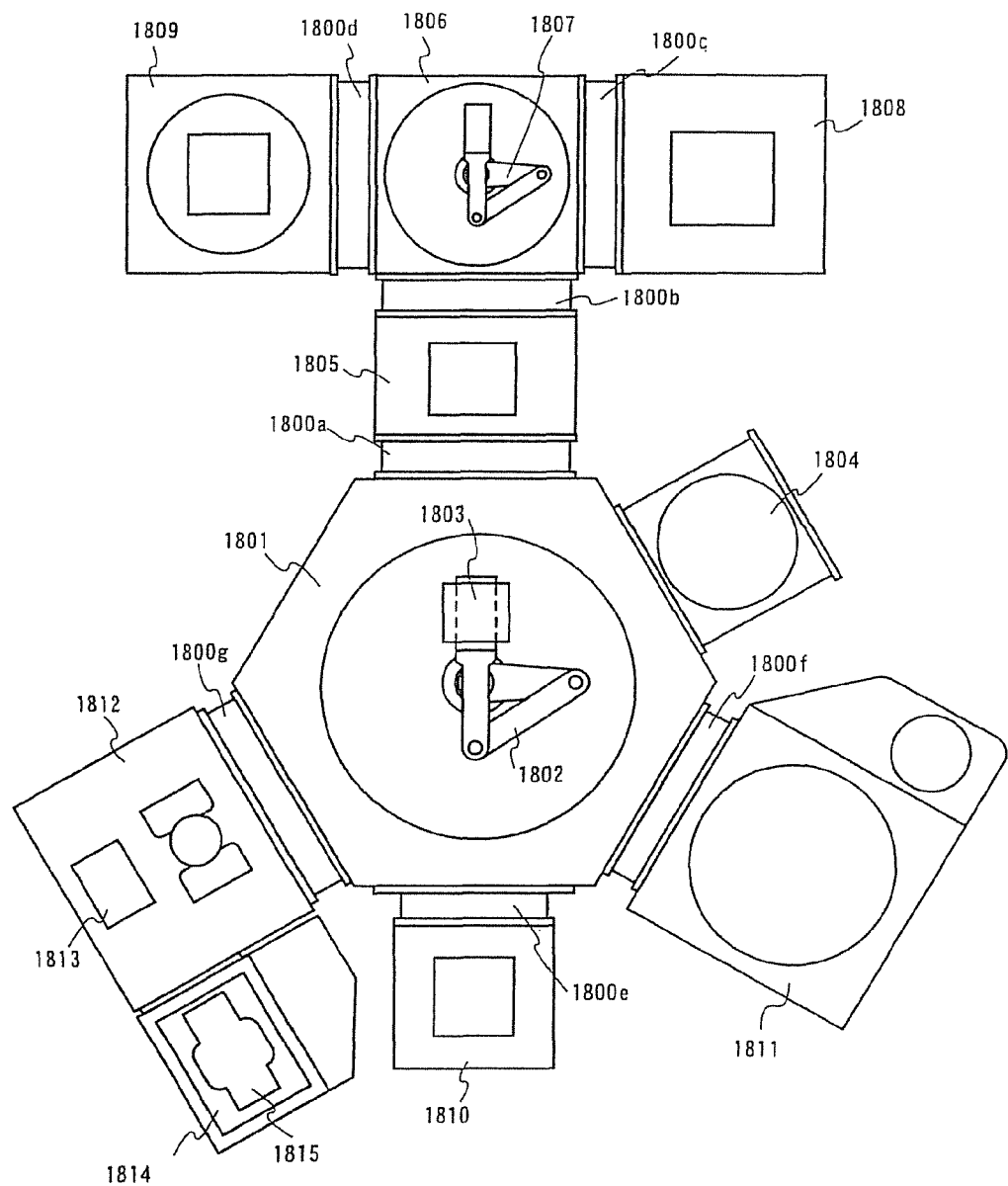
FIG. 18 shows a thin film forming apparatus for forming an EL layer.

As described in the above, the film formation apparatus shown in FIG. 18 allows the EL element to be completely sealed into a closed space without being exposed to the ambient air, and accordingly, realizes fabrication of a light-emitting device having a high reliability.

Embodiment 12

The gate-side driving circuit as shown in FIG. 1 and the source-side driving circuit as shown in FIG. 3 can be applied, not only to the light-emitting, device, but also to the liquid crystal display device. An external appearance of the liquid crystal display device in accordance with the present invention is illustrated in FIG. 19(A), while FIG. 19(B) illustrates the cross-sectional structure of its pixel section.

Figure 19A:
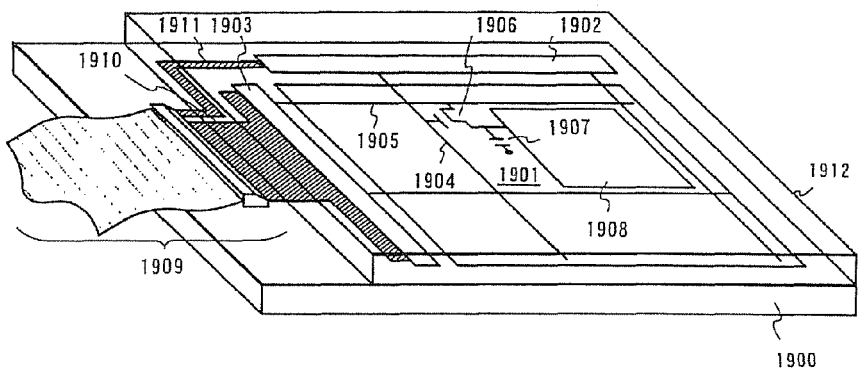
FIGS. 19(A) and 19(B) show external appearances of a liquid crystal display device.

In FIG. 19(A), a pixel section 1901, a gate-side driver circuit 1902 and a source-side driver circuit 1903 are formed on a substrate 1900. In this case, the pixel section as shown in FIG. 5 is used as the pixel section 1901. Moreover, the gate-side driving circuit shown in FIG. 1 is used as the gate-side driver circuit 1902, while the source-side driving circuit shown in FIG. 3 is used as the source-side driver circuit 1903.

A gate wiring 1904 and a source wiring 1905 extend from the gate-side driver circuit 1902 and the source-side driver circuit 1903, respectively, and a pixel TFT 1906 is formed at the crossing point of the gate wiring 1904 and the source wiring 1905. To the pixel TFT 1906, a retaining capacitance 1907 and a liquid crystal element 1908 are connected in parallel. Furthermore, connecting wirings 1910 and 1911 are formed to extend from an FPC 1909 to input terminals of the driver circuits. Reference numeral 1912 denotes a counter substrate.

Figure 19B:
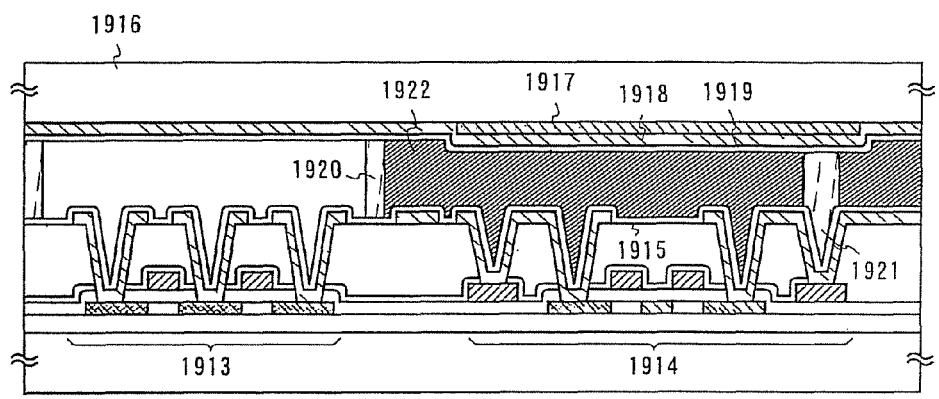

In the pixel structure as shown in FIG. 19(B), the p-channel TFT 1913 forming the driver circuit and the p-channel TFT 1914 serving as the switching element may be fabricated in accordance with Embodiment 2 described previously. It should be noted that reference numeral 1915 denotes an orientation film, 1916 denotes a counter substrate. 1917 denotes a light shielding film, 1918 denotes a counter electrode. 1919 denotes an orientation film, 1920 denotes a sealing member, 1921 denotes a spacer made of a resin, and 1922 denotes liquid crystal. These components may be formed by any known method. Furthermore, the structure of the liquid crystal element is not limited to that described in the present embodiment.

Embodiment 13

Although the examples in which the pixel section and the driver circuit are formed of p-channel TFTs have been described in Embodiments 1 through 10 and 12, it is also possible to form the pixel section and the driver, only of n-channel TFTs. In this case, the driver circuits are required to be slightly modified such that, for example, the polarities of the power source lines are inverted in the driver circuits.

In such a case, the anode and the cathode are replaced with each other, so that the structure of the EL element is reversed. In other words, it is preferable to realize a structure in which the cathode is connected to a drain of the current-controlling TFT. It should be noted that in Embodiments 8 to 10, all TFTs other than the switching TFT and the current-controlling TFT, if they exist in the pixel, are formed as the n-channel TFT.

Embodiment 14

In the light-emitting device as described in Embodiment 1, it is preferable to provide a silicon nitride film or a silicon oxynitride film as the underlying film 502, and to cover the switching TFT 601 and the current-controlling TFT 602 with the passivation film 517 including a silicon nitride film or a silicon oxynitride film.

In such a structure, the switching TFT 601 and the current-controlling TFT 602 are sandwiched between the silicon nitride film or the silicon oxynitride film. Thus, water or movable ions can be effectively prevented from entering into the device from the external atmosphere.

Moreover, it is preferable to provide a silicon nitride film or a DLC (diamond-like carbon) film between the pixel electrode 523 and a planarization film 518 made of an organic resin formed on the passivation film 517, and further provide the aforementioned silicon nitride film or DLC film on the cathode.

In such a structure, the EL element is sandwiched between the silicon nitride films or the DLC films. Thus, not only water or movable ions from the external atmosphere but also oxygen can be effectively prevented from entering into the device. Although the organic materials to be used in the light-emitting layer or the like in the EL element are otherwise likely to be easily oxidized thereby resulting in deterioration, the structure in the present embodiment can allow the reliability of the device to be significantly improved.

As described in the above, reliability of the entire light-emitting device can be improved by providing a measure for protecting the TFTs as well as a measure for protecting the EL element.

The structure as described in the present embodiment can be freely combined with any structures in Embodiments 1 through 10.

Embodiment 15

The display device formed by implementing the present invention can be used as a display portion of various kinds of electric equipments. For instance, when appreciating a television broadcast or the like, a display incorporating a 20 to 60 inch diagonal display device of the present invention in a casing may be used. Note that a personal computer display, a television broadcast receiving display, and a display for exhibiting all information such as a display for displaying announcements are included in the displays having the display device incorporated in a casing.

The following can be given as other electronic equipments of the present invention: a video camera; a digital camera; a goggle type display (head mounted display); a navigation system; an audio playback device (such as a car audio stereo or an audio component stereo); a notebook type personal computer; a game apparatus: a portable information terminal (such as a mobile computer, a portable telephone, a portable game machine, or an electronic book); and an image playback device equipped with a recording medium (specifically, device provided with a display portion which plays back images in a recording medium and displays the images). Specific examples of these electronic equipments are shown in FIGS. 20 and 21.

Figure 20A:
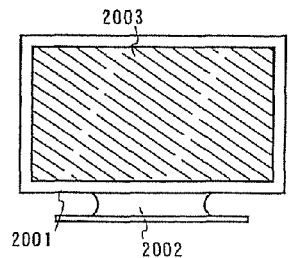
FIGS. 20(A) through 20(F) show specific examples of an electrical apparatus, respectively.

FIG. 20A shows a display having a display device incorporated in a casing, and the display contains a casing 2001, a support stand 2002, a display portion 2003 and the like. The display device of the present invention can be used as the display portion 2003.

Figure 20B:
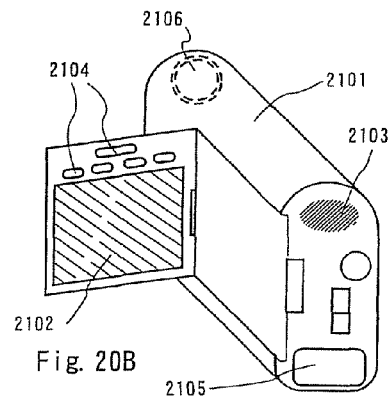

FIG. 20B shows a video camera, and contains a main body 2101, a display portion 2102, a sound input portion 2103, operation switches 2104, a battery 2105, an image receiving portion 2106 and the like. The display device of the present invention can be used as the display portion 2102.

Figure 20C:
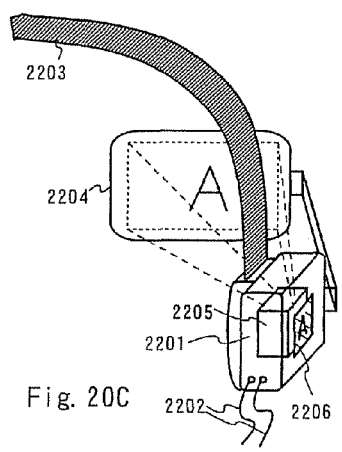

FIG. 20C is a portion (right side) of a head mounted EL display, and contains a main body 2201, a signal cable 2202, a head fixing band 2203, a display portion 2204, an optical system 2205, a light-emitting device 2206 and the like. The present invention can be applied to the self-emitting device 2206.

Figure 20D:
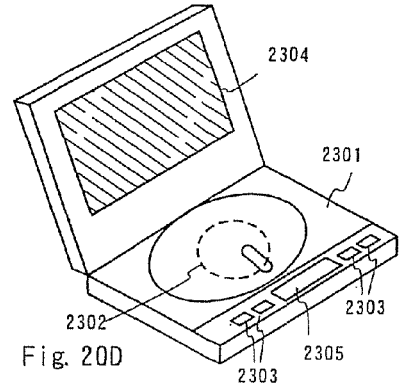

FIG. 20D is an image playback device equipped with a recording medium (specifically, a DVD playback device), and contains a main body 2301, a recording medium (such as a DVD) 2302, operation switches 2303, a display portion (a) 2304, a display portion (b) 2305 and the like. The display portion (a) 2304 is mainly used for displaying image information. The display portion (b) 2305 is mainly used for displaying character information. The display device of the present invention can be used as the display portion (a) 2304 and as the display portion (b) 2305. Note that the image playback device equipped with the recording medium includes devices such as household game machines.

Figure 20E:
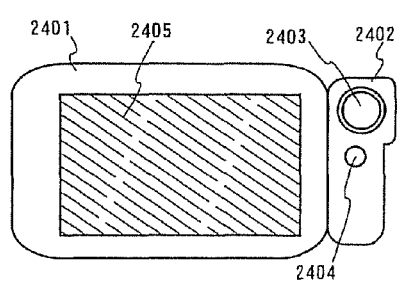

FIG. 20E shows a portable (mobile) computer, and contains a main body 2401, a camera portion 2402, an image receiving portion 2403, operation switches 2404, a display portion 2405 and the like. The display device of the present invention can be used as the display portion 2405.

Figure 20F:
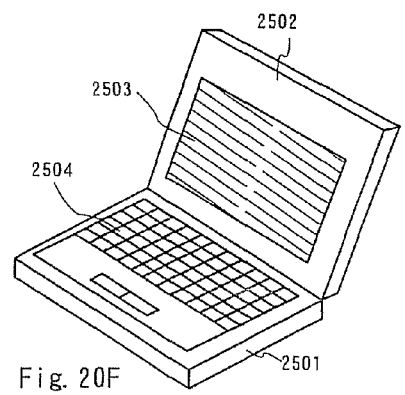

FIG. 20F is a personal computer, and contains a main body 2501, a casing 2502, a display portion 2503, a keyboard 2504 and the like. The display device of the present invention can be used as the display portion 2503.

Figure 21A:
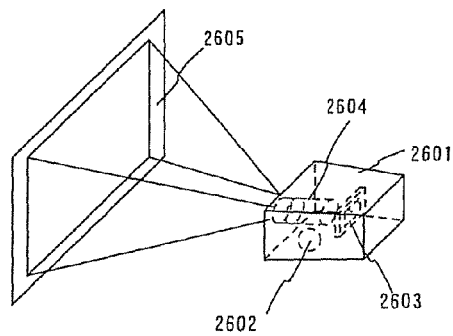
FIGS. 21(A) through 21(D) show specific examples of an electrical apparatus, respectively.

FIG. 21A shows a rear type projector (projection TV) comprising a main body 2601, an optical source 2602, a liquid crystal display device 2603, a polarization beam splitter 2604, reflectors 2605 and 2606 and a screen 2607. The present invention is applicable to the liquid crystal display device 2603.

Figure 21B:
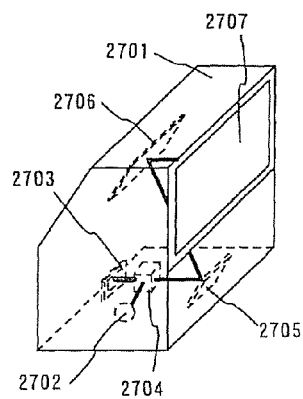

FIG. 21B shows a front type projector comprising a main body 2701, an optical source 2702, a liquid crystal display device 2703, an optical system 2704 and a screen 2705. The present invention is applicable to the liquid crystal display device 2703.

Note that, if the luminance further increases in the future, although not shown, then it will become possible to use the light-emitting device of the present invention in a front type or a rear type projector by expanding and projecting light containing output image information with a lens, an optical fiber or the like.

In addition, since the light-emitting device conserves power in the light-emitting portion, it is preferable to display information so as to make the light-emitting portion as small as possible. Consequently, when using the light-emitting device in a display portion mainly for character information, such as in a portable information terminal, in particular a portable telephone or an audio playback device, it is preferable to drive the light-emitting device so as to form character information by the light-emitting portions while non-light-emitting portions are set as background.

Figure 21C:
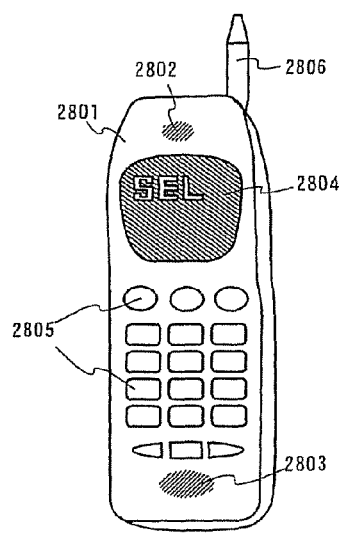

FIG. 21C shows a portable telephone, and contains a main body 2801, a sound output portion 2802, a sound input portion 2803, a display portion 2804, operation switches 2805, and an antenna 2806. The light-emitting device of the present invention can be used as the display portion 2804. Note that by displaying white color characters in a black color background, the display portion 2804 can suppress the power consumption of the portable telephone. Of course, it is possible to also use the liquid crystal display device of the present invention for the display portion 2804.

Figure 21D:
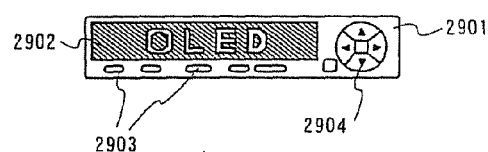

FIG. 21D shows an audio playback device, specifically a car audio stereo, and contains a main body 2901, a display portion 2902, and operation switches 2903 and 2904. The light-emitting device of the present invention can be used as the display portion 2902. Further, a car audio stereo is shown in this embodiment, but a portable type or a household audio playback device may also be used. Note that by displaying white color characters in a black color background, the display portion 2904 can suppress the power consumption. This is especially effective in a portable type audio playback device. Of course, it is possible to also use the liquid crystal display device of the present invention for the display portion 2804.

Thus, the application range of the present invention is extremely wide, whereby it may be employed in electric equipments of all fields. Further, the electric equipments of this embodiment may employ the light-emitting device having any of the constitutions of Embodiments 1 through 14.

Thus, in accordance with the present invention, the display device can be fabricated with very small number of fabrication steps. Accordingly, a fabrication yield can be increased, while a fabrication cost can be reduced, thereby resulting in an inexpensive display device being fabricated.

Furthermore, since an inexpensive display device can be provided, various electrical apparatuses which employ the display device in their display section can be provided at a low price.

What is claimed is:

1. A light-emitting device comprising:
   a first transistor;
   a second transistor;
   a third transistor;
   a first conductive film;
   a second conductive film;
   a first wiring;
   a second wiring;
   a third wiring;
   a fourth wiring;
   a fifth wiring; and
   an EL element,
   wherein the first conductive film comprises a first region configured to function as a sixth wiring, a second region configured to function as a gate electrode of the first transistor and a third region configured to function as a gate electrode of the second transistor,
   wherein the second conductive film comprises a first region configured to function as a seventh wiring and a second region configured to function as a gate electrode of the third transistor,
   wherein one of a source and a drain of the first transistor is electrically connected to the first wiring,
   wherein the other of the source and the drain of the first transistor is electrically connected to one of a source and a drain of the second transistor,
   wherein the other of the source and the drain of the second transistor is electrically connected to the seventh wiring through the second wiring,
   wherein one of a source and a drain of the third transistor is electrically connected to the third wiring,
   wherein the other of the source and the drain of the third transistor is electrically connected to the EL element through the fourth wiring,
   wherein the fifth wiring is electrically connected to the sixth wiring,
   wherein the fifth wiring comprises a region overlapping with the first wiring,
   wherein the first conductive film, the second conductive film and the first wiring comprise a same metal material, and
   wherein the second wiring, the fourth wiring and the fifth wiring comprise a same metal material.

2. The light-emitting device according to claim 1, wherein each of the first transistor, the second transistor and the third transistor has a top-gate structure.

3. The light-emitting device according to claim 1, further comprising an insulating film over the first conductive film, the second conductive film, the first wiring, the second wiring, the third wiring, the fourth wiring and the fifth wiring, wherein the insulating film comprises a resin.

4. The light-emitting device according to claim 1, further comprising a silicon nitride film or a silicon oxynitride film over the first transistor, the second transistor and the third transistor.

5. The light-emitting device according to claim 1, further comprising a flexible printed circuit.

6. An electric equipment comprising the light-emitting device according to claim 1, and at least one of an operation switch, an antenna and a battery.

7. The electric equipment according to claim 6, wherein the electric equipment is selected from the group consisting of a display, a camera, an image playback device, computer and a projector.

8. A device comprising:
   a first transistor;
   a second transistor;
   a third transistor;
   a first conductive film;
   a second conductive film;
   a first wiring;
   a second wiring;
   a third wiring;
   a fourth wiring;
   a fifth wiring; and
   a pixel electrode,
   wherein the first conductive film comprises a first region configured to function as a sixth wiring, a second region configured to function as a gate electrode of the first transistor and a third region configured to function as a gate electrode of the second transistor,
   wherein the second conductive film comprises a first region configured to function as a seventh wiring and a second region configured to function as a gate electrode of the third transistor,
   wherein one of a source and a drain of the first transistor is electrically connected to the first wiring,
   wherein the other of the source and the drain of the first transistor is electrically connected to one of a source and a drain of the second transistor,
   wherein the other of the source and the drain of the second transistor is electrically connected to the seventh wiring through the second wiring,
   wherein one of a source and a drain of the third transistor is electrically connected to the third wiring,
   wherein the other of the source and the drain of the third transistor is electrically connected to the pixel electrode through the fourth wiring,
   wherein the fifth wiring is electrically connected to the sixth wiring,
   wherein the fifth wiring comprises a region overlapping with the first wiring,
   wherein the first conductive film, the second conductive film and the first wiring comprise a same metal material, and
   wherein the second wiring, the fourth wiring and the fifth wiring comprise a same metal material.

9. The device according to claim 8, wherein each of the first transistor, the second transistor and the third transistor has a top-gate structure.

10. The device according to claim 8, further comprising an insulating film over the first conductive film, the second conductive film, the first wiring, the second wiring, the third wiring, the fourth wiring and the fifth wiring, wherein the insulating film comprises a resin.

11. The device according to claim 8, further comprising a silicon nitride film or a silicon oxynitride film over the first transistor, the second transistor and the third transistor.

12. The device according to claim 8, further comprising a flexible printed circuit.

\* \* \* \* \*

UNITED STATES PATENT AND TRADEMARK OFFICE
CERTIFICATE OF CORRECTION

PATENT NO. : 8,717,262 B2
APPLICATION NO. : 13/731482
DATED : May 6, 2014
INVENTOR(S) : Jun Koyama It is certified that error appears in the above-identified patent and that said Letters Patent is hereby corrected as shown below:

In the Specification:

Column 2, Line 26; Change "increasing, a" to --increasing a--.

Column 5, Line 23; Change "switching, element" to --switching element--.

Column 7, Line 48; Change "suicide" to --silicide--.

Column 11, Line 56; Change "TFT. 1004" to --TFT, 1004--.

Column 13, Line 42; Change "(BrF)," to --(BrF$_3$),--.

Column 13, Line 60; Change "m$^3$/s) and" to --m$^3$/s), and--.

Column 17, Lines 43 thru 44; Change "being, faced-down." to --being faced-down.--.

Column 18, Lines 21 thru 22; Change "n-conjugated" to --π-conjugated--.

Column 19, Line 67; Change "light-emitting, device," to --light-emitting device,--.

Column 20, Line 27; Change "substrate. 1917" to --substrate, 1917--.

Column 20, Line 28; Change "electrode. 1919" to --electrode, 1919--.

Column 21, Line 39; Change "apparatus: a" to --apparatus; a--.

Signed and Sealed this
Second Day of December, 2014

Michelle K. Lee
*Deputy Director of the United States Patent and Trademark Office*